United States Patent [19]

Sugimoto et al.

[11] Patent Number: 5,356,834
[45] Date of Patent: Oct. 18, 1994

[54] METHOD OF FORMING CONTACT WINDOWS IN SEMICONDUCTOR DEVICES

[75] Inventors: Shigeki Sugimoto; Katsuya Okumura, both of Yokohama, Japan

[73] Assignee: Kabushiki Kaisha Toshiba, Kawasaki, Japan

[21] Appl. No.: 35,656

[22] Filed: Mar. 23, 1993

[30] Foreign Application Priority Data

Mar. 24, 1992 [JP] Japan .................. 4-66431
Mar. 25, 1992 [JP] Japan .................. 4-67130

[51] Int. Cl.⁵ ........................................ H01L 21/441
[52] U.S. Cl. .................... 437/190; 437/968; 437/978; 148/DIG. 133
[58] Field of Search ............ 437/47, 60, 190, 191, 437/193, 195, 240, 919, 968, 981, 982; 148/DIG. 14, DIG. 43, DIG. 133

[56] References Cited

U.S. PATENT DOCUMENTS 5,006,481 4/1991 Chan et al. ................. 437/919
5,073,510 12/1991 Kwon et al. ................ 437/978
5,104,822 4/1992 Butler ........................ 437/919

FOREIGN PATENT DOCUMENTS 2-30124 1/1990 Japan .

*Primary Examiner*—Tom Thomas
*Assistant Examiner*—Chandra Chaudhari
*Attorney, Agent, or Firm*—Finnegan, Henderson, Farabow, Garrett & Dunner

[57] ABSTRACT

A manufacturing method of semiconductor devices according to this invention, comprises the step of forming pattern portions containing internal wiring layers on a semiconductor substrate, the step of forming interlayer insulating films on said semiconductor substrate, the step of forming an opening portion in said interlayer insulating films so as to allow the pattern portions and the substrate to appear, and the step of forming a sidewall insulating film on the sidewall of the pattern portions appearing in the opening portion.

18 Claims, 41 Drawing Sheets

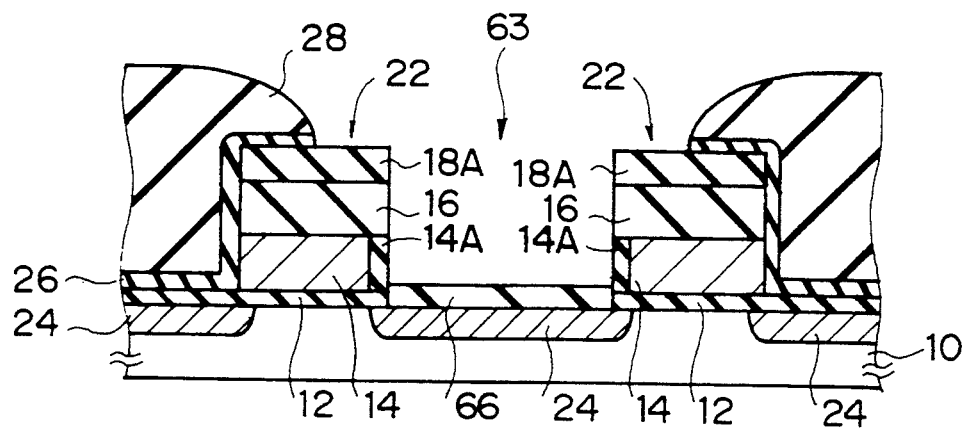
F I G. 1F
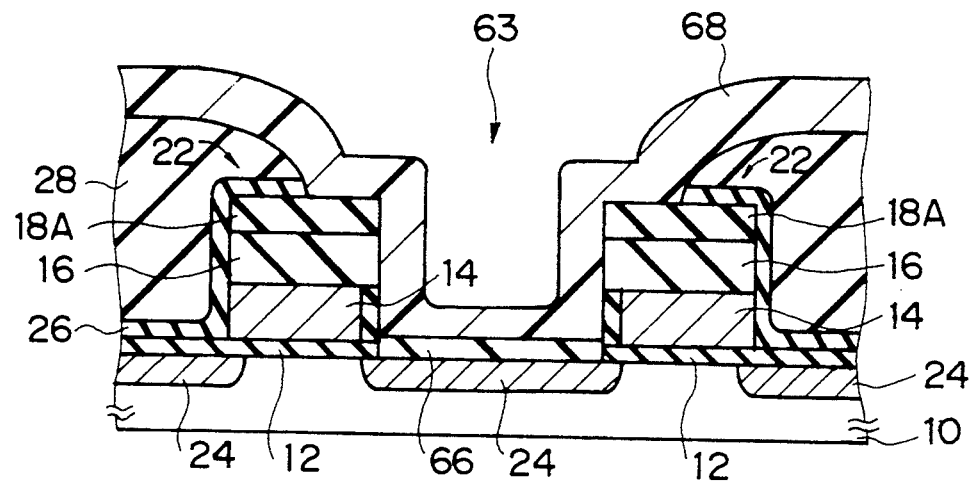
F I G. 1G

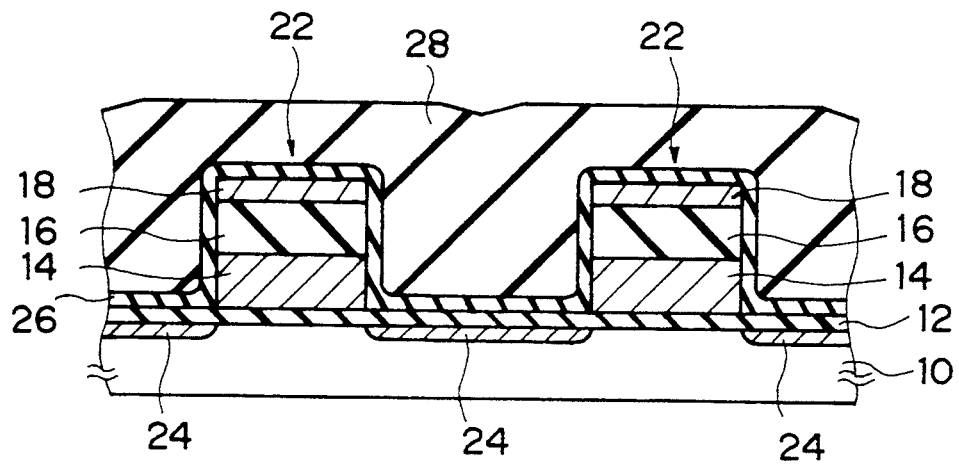
F I G. 2A
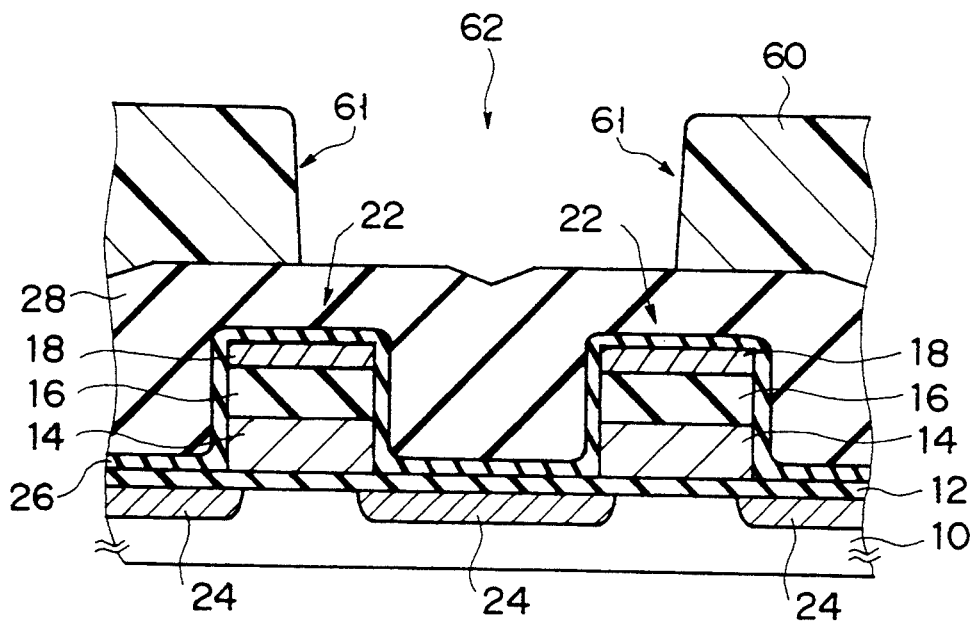
F I G. 2B

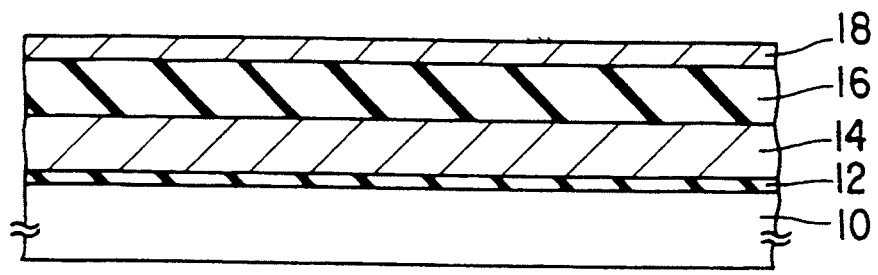
F I G. 3A
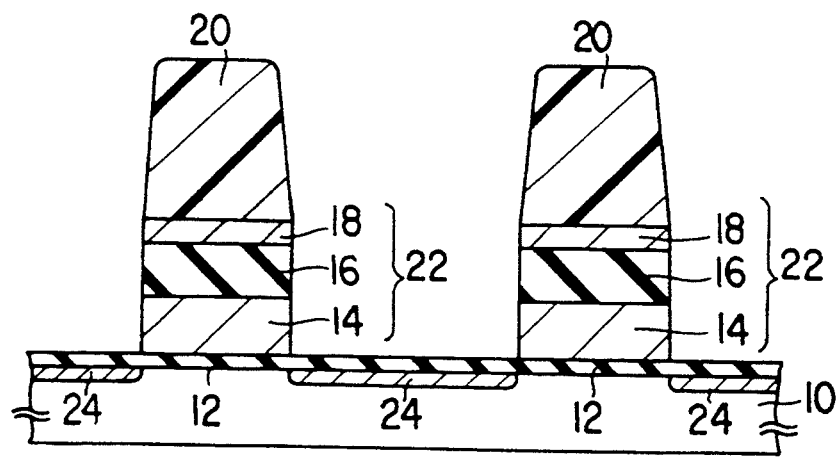
F I G. 3B
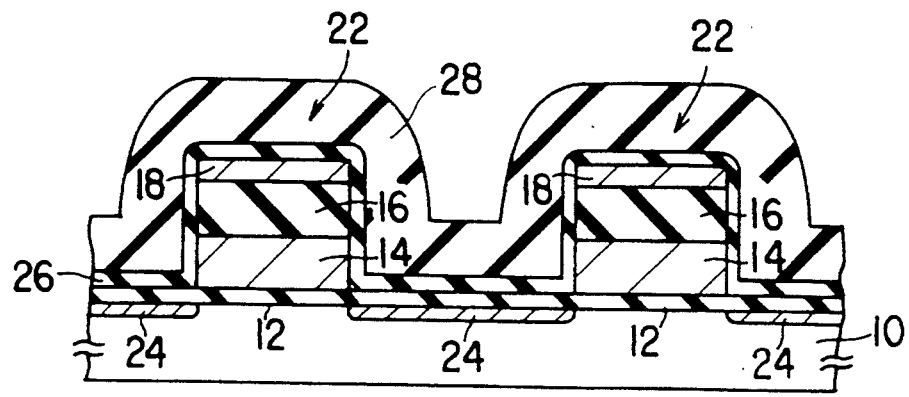
F I G. 3C

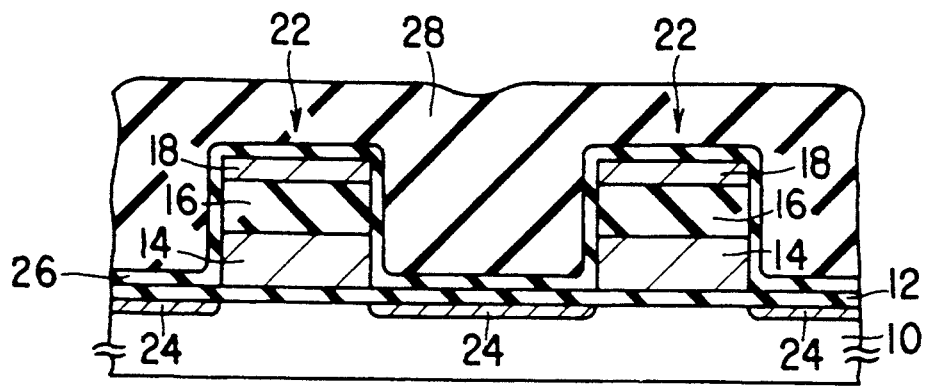
F I G. 3D
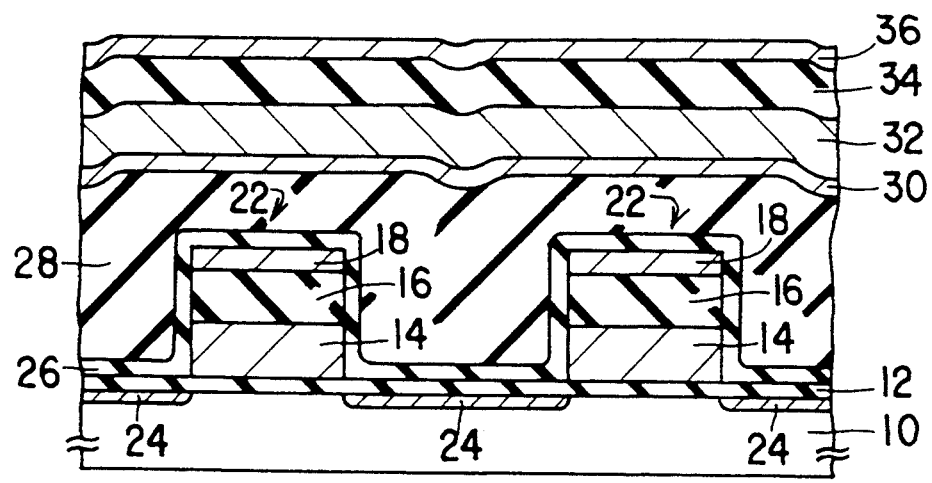
F I G. 3E

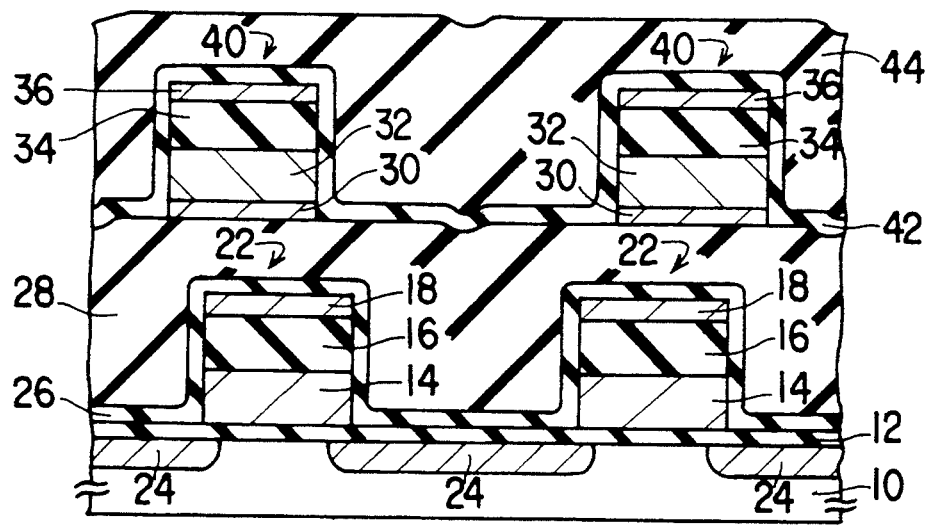
F I G. 3H
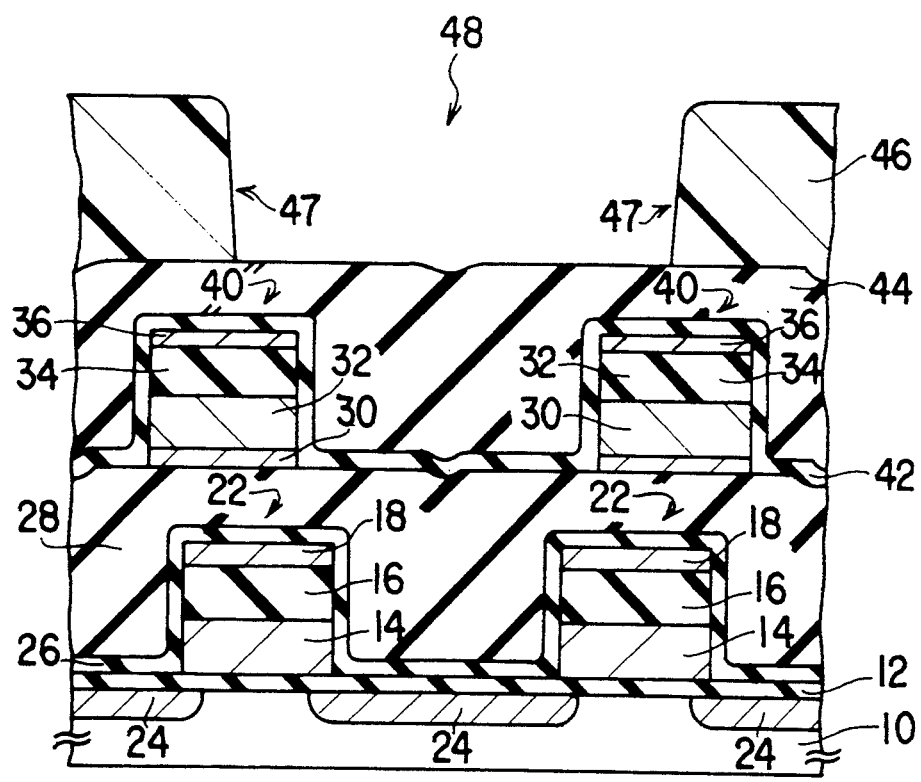
F I G. 3I

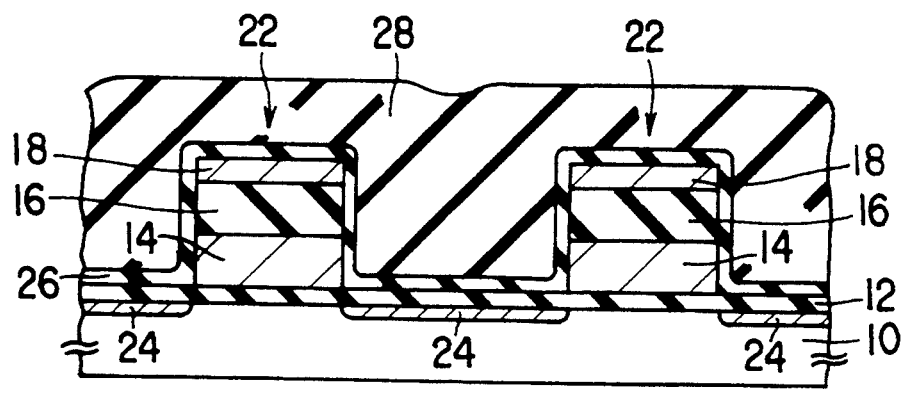
F I G. 4A
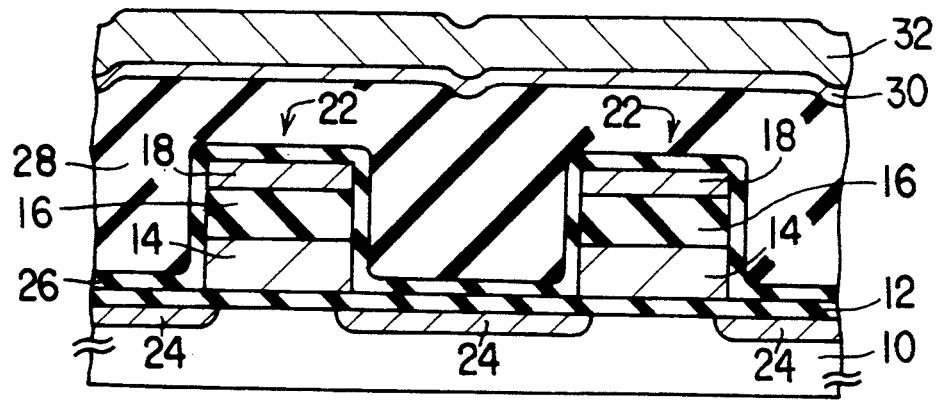
F I G. 4B

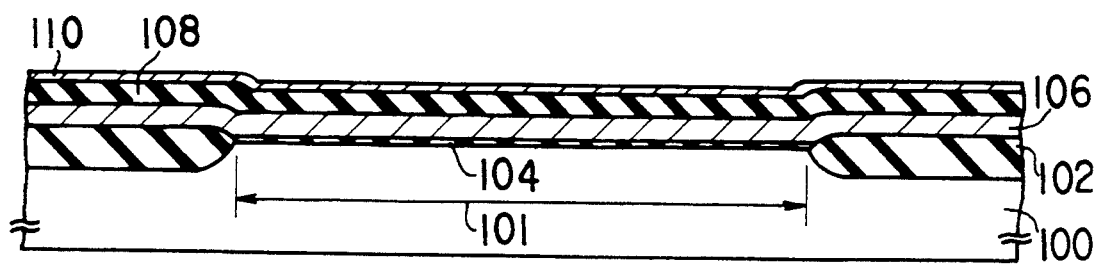
F I G. 7A
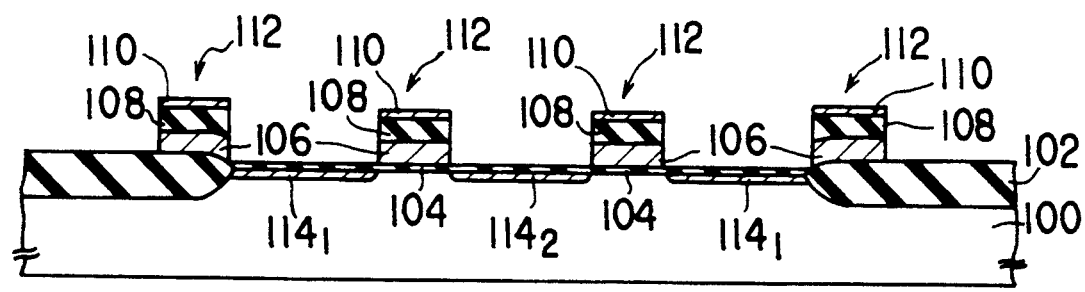
F I G. 7B
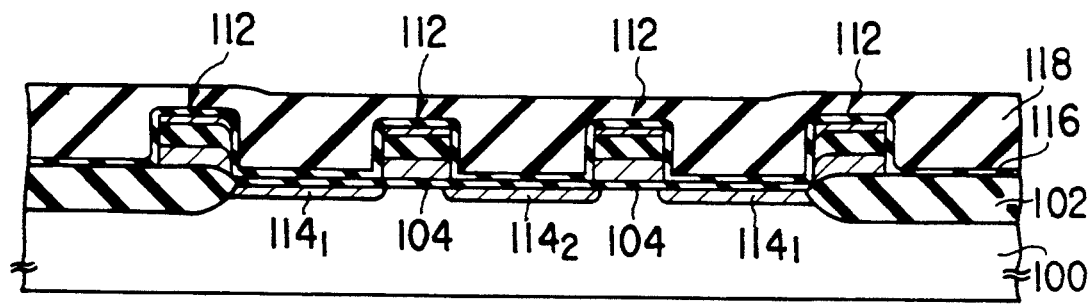
F I G. 7C

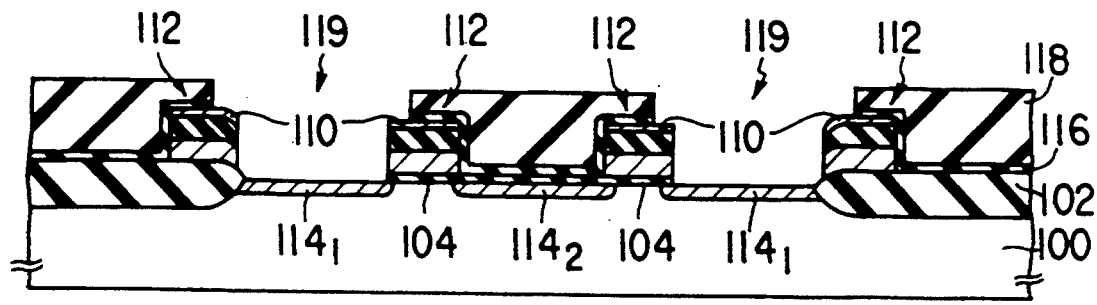
F I G. 7D
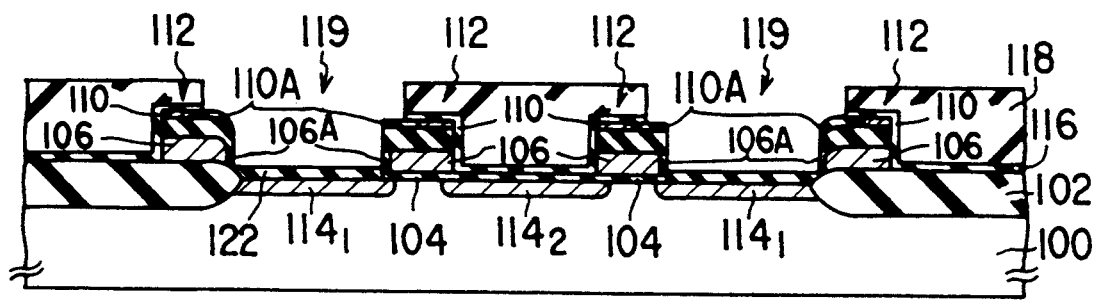
F I G. 7E
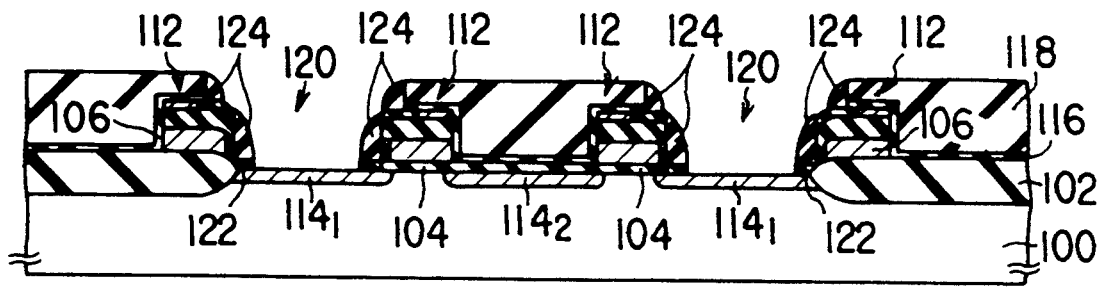
F I G. 7F

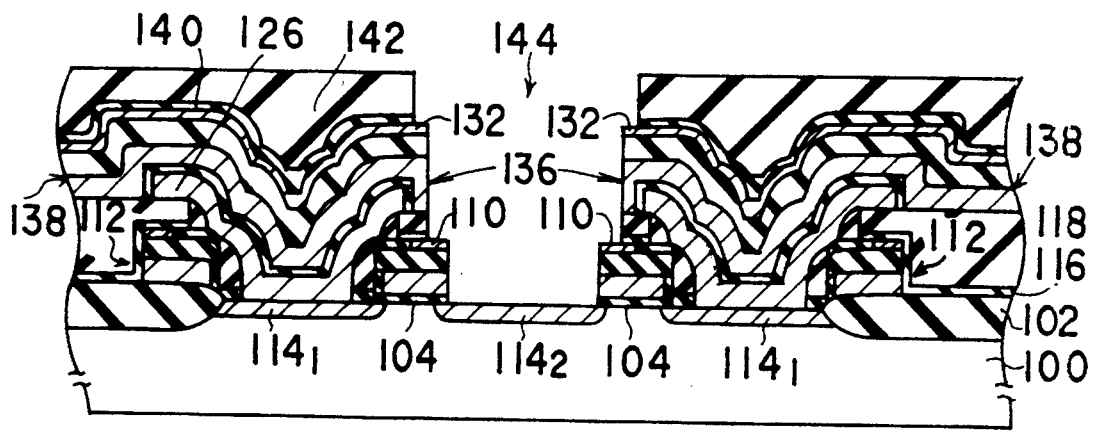
F I G. 7L
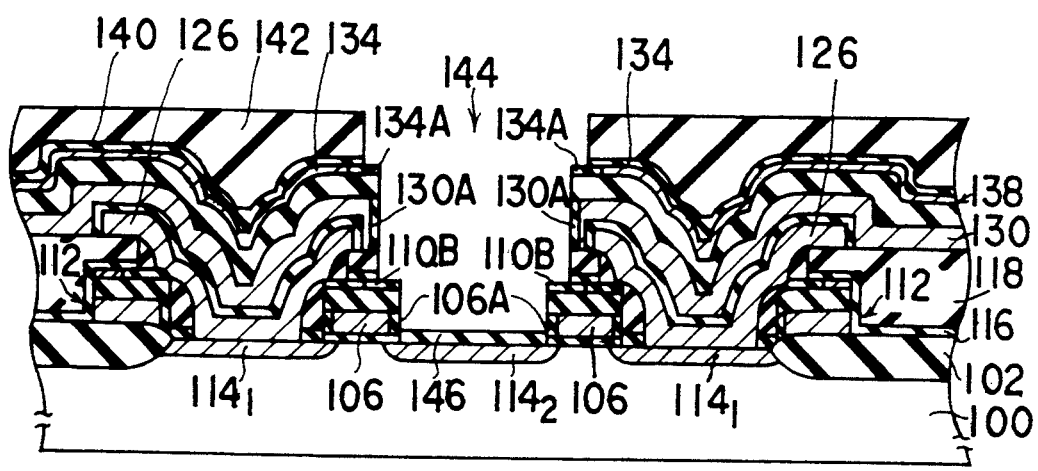
F I G. 7M

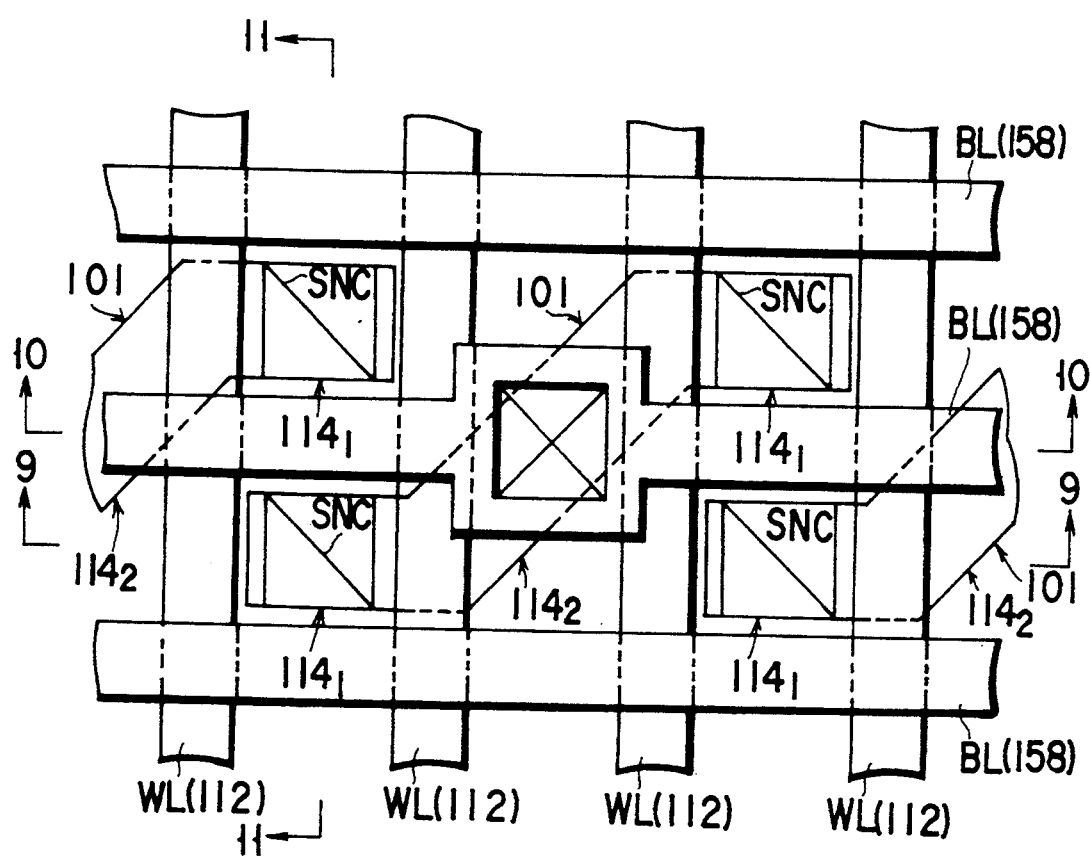
F I G. 8

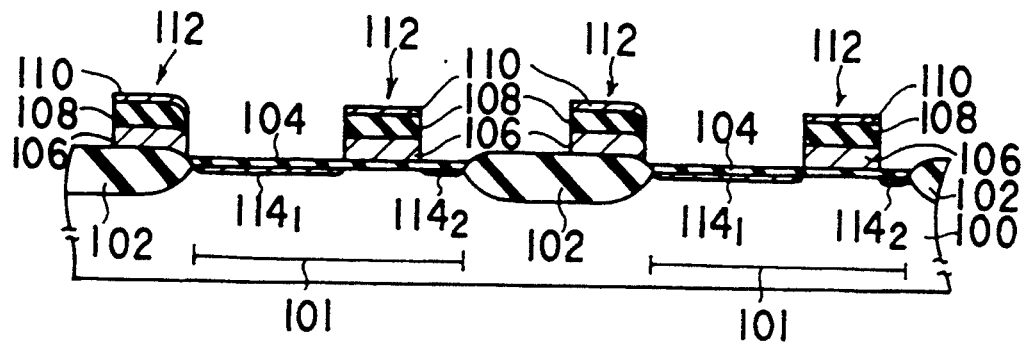
F I G. 9A
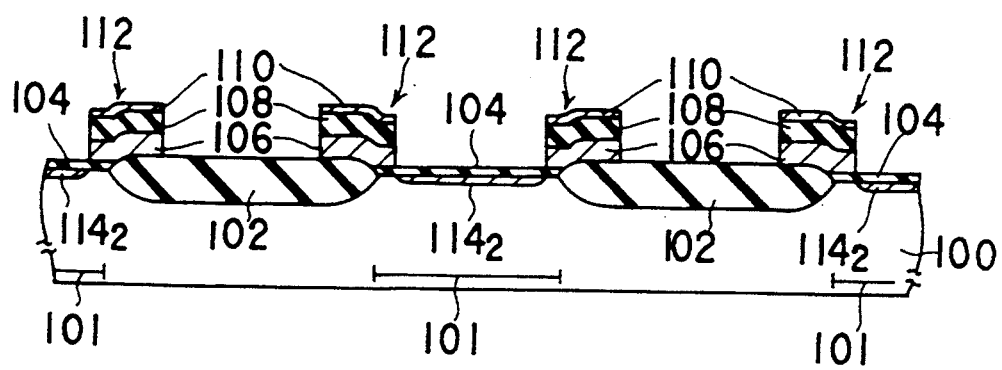
F I G. 10A
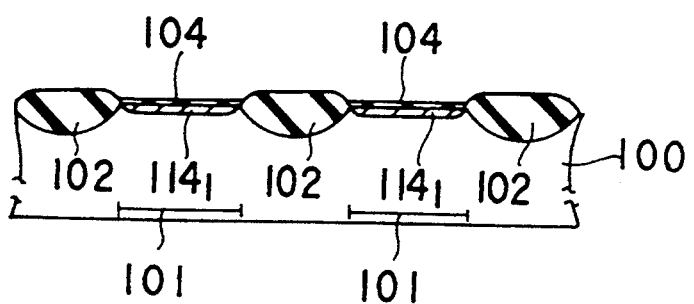
F I G. 11A

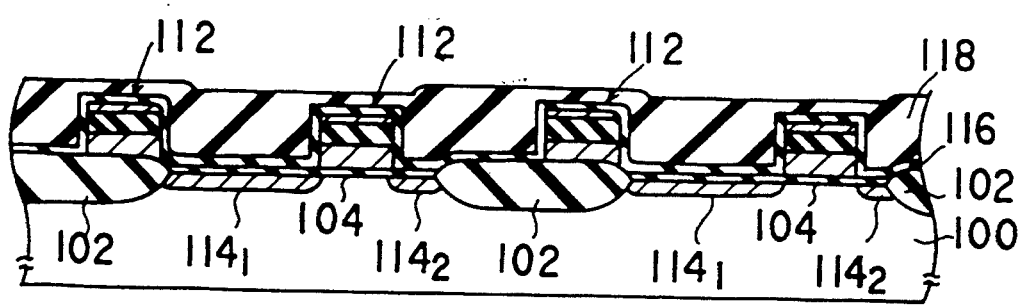
F I G. 9D
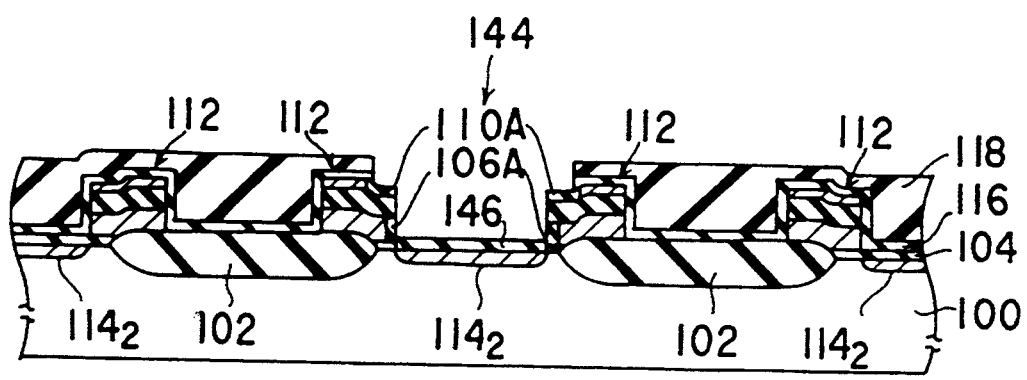
F I G. 10D
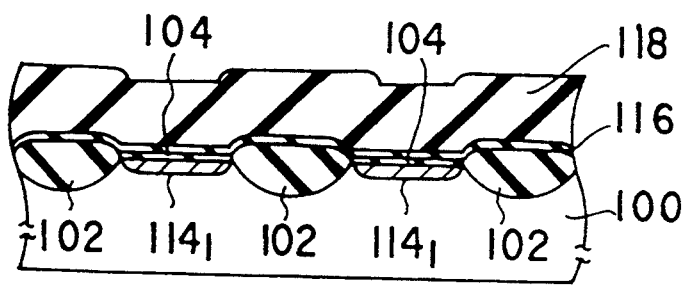
F I G. 11D

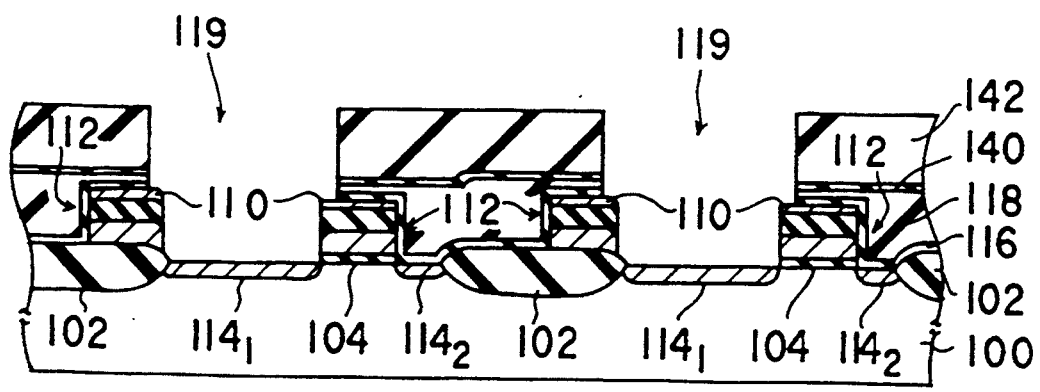
F I G. 9H
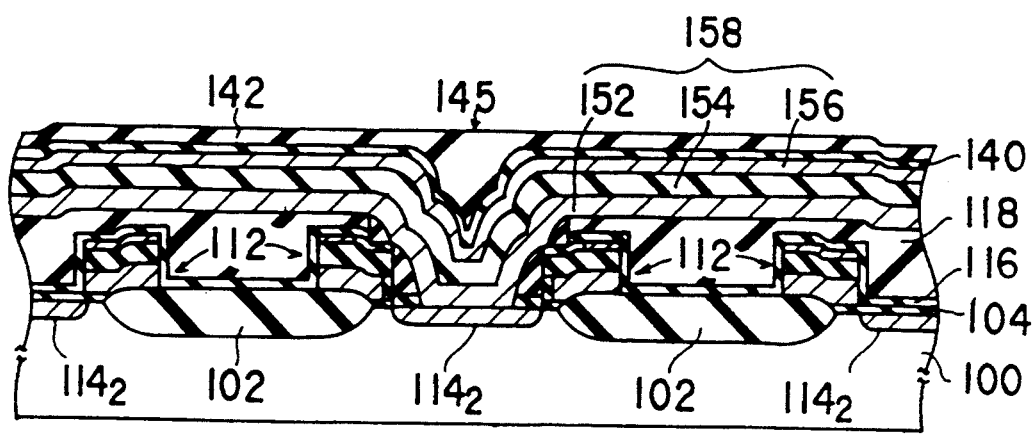
F I G. 10H
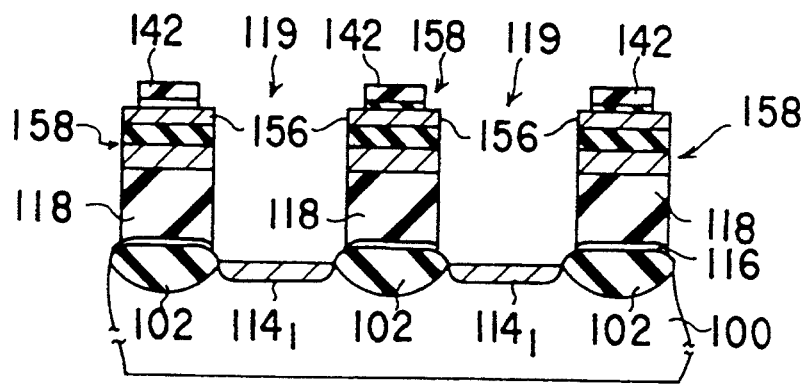
F I G. 11H

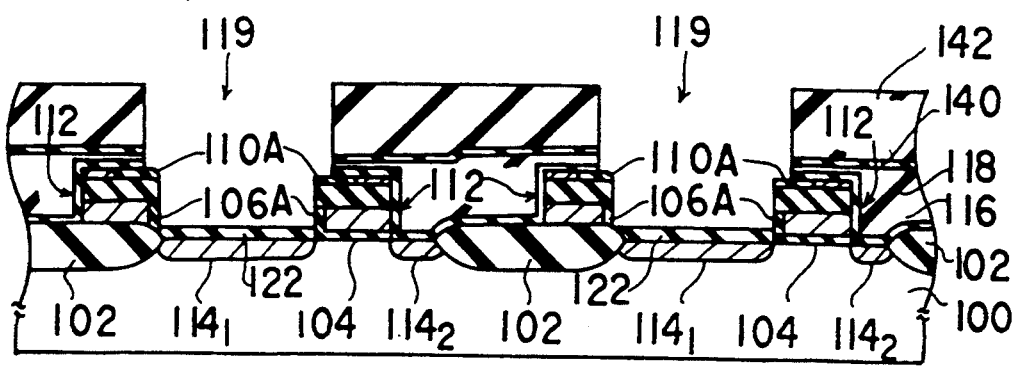
F I G. 9I
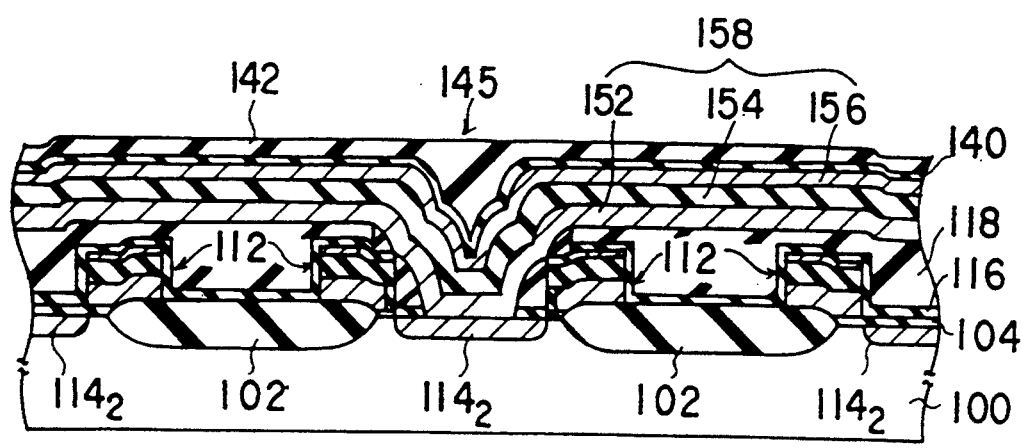
F I G. 10I
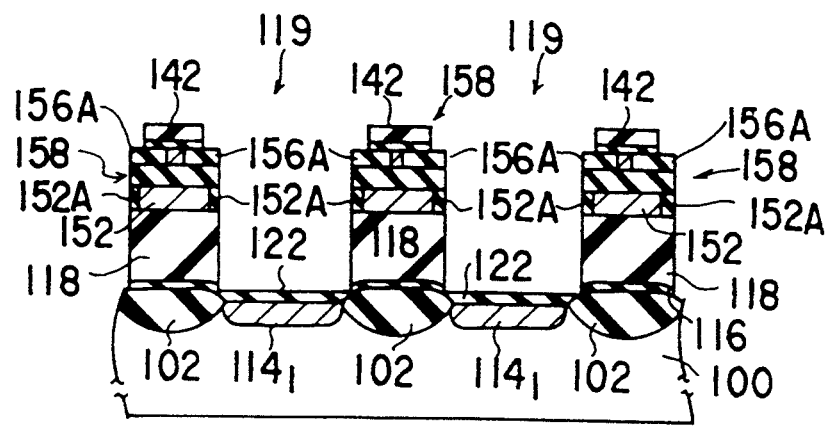
F I G. 11I

METHOD OF FORMING CONTACT WINDOWS IN SEMICONDUCTOR DEVICES

BACKGROUND OF THE INVENTION

1. Field of the Invention

This invention relates to a method of forming contact windows in semiconductor devices, and more particularly to a method of forming contact windows in wiring-layer patterns in a self-aligning manner.

2. Description of the Related Art

As semiconductor elements becomes smaller and smaller, it gets more difficult to allow design flexibility to the spacing between contact windows and their adjacent wiring layer patterns.

In conventional lithography techniques, it is necessary to take into account aligning allowance for a mask slip between contact windows and wiring patterns as well as allowance for a variation in the contact window diameter, which hinders the more microscopic design of semiconductor devices.

To deal with this problem, what are called self-aligning contact techniques have been developed which separate the wiring patterns from the contact windows by means of a sidewall insulating film formed on the sidewall of the wiring layer patterns.

Some of conventional general self-aligned contact technique have been disclosed in, for example, Published Unexamined Japanese Patent Application No. 2-30124.

Self-aligning contact techniques disclosed in Published Unexamined Japanese Patent Application No. 2-30124 are roughed out as follows.

A polysilicon film and a CVD silicon oxide film are patterned at a time to form a pattern including an internal wiring layer (hereinafter, referred to as a gate) on a silicon substrate. Then, a sidewall insulating film of a CVD silicon oxide film is formed on the sidewall of the pattern. Next, silicon nitride and silicon are sequentially deposited on the substrate to form a silicon nitride film and a polysilicon film. Then, borophosphosilicate glass (hereinafter, referred to as BPSG) is deposited on the polysilicon film to form a BPSG film. Then, photoresist is applied to the BPSG film to form a resist film. Using photolithography techniques, the resist film is then etched to form a resist pattern with windows in it. Next, using REI techniques, the BPSG film is etched with the resist pattern as a mask to form contact windows. At this time, the etching is ceased at the time when the polysilicon film is exposed. Then, the polysilicon is oxidized using thermal oxidation techniques. At this time, the BPSG film is allowed to reflow by heat caused in the oxidation process. The silicon nitride film functions as a barrier layer that stops the progress of oxidation. Then, using RIE techniques, the silicon nitride film and the oxide film formed on the surface of the substrate are removed with the BPSG film as a mask. Next, using sputtering techniques, aluminium alloy is deposited on the substrate to form an aluminum alloy film. Then, the aluminium alloy film is patterned to form a metal wiring layer that is electrically connected to the substrate via contact windows.

The above-mentioned self-aligning contact techniques have the following problems.

After the formation of the sidewall insulating film, the interlayer insulating (the BPSG film) is formed on the substrate. After this, using RIE techniques, the interlayer insulating film is etched to form contact windows in the BPSG film, so that the insulating film having the most important effect on the gate insulating properties, or the sidewall insulating film, is exposed to an etchant used to form contact windows. This thins the sidewall insulating film, which makes it difficult to control the remaining film amount. If the sidewall insulating film becomes thinner too much, there appears an electric leak path between the metal wiring layer and the gate, leading to insulating failure.

SUMMARY OF THE INVENTION

A first object of the present invention is to provide a manufacturing method of semiconductor devices that is capable of preventing the sidewall insulating film from thinning and of forming contact windows in a self-aligning manner with reference to the internal wiring layer without degrading the insulating properties of the sidewall insulating film.

A second object of the present invention is to provide a manufacturing method of semiconductor devices that is capable of preventing the sidewall insulating film from thinning even for a multi-internal wiring layer structure and of forming contact windows in a self-aligning manner with reference to one of the multiple internal wiring layer without degrading the insulating properties of the sidewall insulating film.

A third object of the present invention is to provide a manufacturing method of dynamic RAMs that is capable of preventing the sidewall insulating film from thinning and of forming contact windows, used to connect the bit lines to the substrate, in a self-aligning manner with reference to the word lines without degrading the insulating properties of the sidewall insulating film.

A fourth object of the present invention is to provide a manufacturing method of dynamic RAMs that is capable of preventing the sidewall insulating film from thinning and of forming contact windows, used to connect the storage node electrodes to the substrate, in a self-aligning manner with reference to the lines without degrading the insulating properties of the sidewall insulating film.

A fifth object of the present invention is to provide a manufacturing method of semiconductor devices that is capable of forming contact widows while forming a sidewall insulating film in order to prevent the sidewall insulating film from thinning.

A sixth object of the present invention is to provide a manufacturing method of semiconductor devices that prevents the internal wiring layer pattern from being etched even when openings are made in the interlayer insulating film using the internal wiring layer pattern as a mask.

A seventh object of the present invention is to provide a manufacturing method of semiconductor devices that is capable of forming contact windows in a self-aligning manner with reference to the internal wiring layers without degrading the insulation between the internal wiring layers.

An eighth object of the present invention is to provide a manufacturing method of semiconductor devices that is capable of forming contact windows in a self-aligning manner with reference to the internal wiring layers without degrading the insulation between the internal wiring layers even for a multi-internal wiring layer structure.

A ninth object of the present invention is to provide a manufacturing method of dynamic RAMs that is capable of forming contact windows, used to connect the bit lines to the substrate, a self-aligning manner with reference to the word lines without degrading the insulation between the word lines and the bit lines.

A tenth object of the present invention is to provide a manufacturing method of dynamic RAMs that is capable of forming contact windows, used to connect the storage node electrodes to the substrate, in a self-aligning manner with reference to the word lines without degrading the insulation between the word lines and the storage node electrodes.

An eleventh object of the present invention is to provide a manufacturing method of dynamic RAMs that is capable of forming contact windows, used to connect the bit lines to the substrate, in the plate electrodes and in a self-aligning manner with reference to the lines without degrading the insulation between the plate electrodes, the word lines, and the bit lines.

A twelfth object of the present invention is to provide a manufacturing method of dynamic RAMs that is capable of forming contact windows, used to connect the storage node electrodes to the substrate, in a self-aligning manner with reference to the bit lines and the word lines without degrading the insulation between the bit lines, the word lines, and the storage node electrodes.

The foregoing objects are accomplished by providing a manufacturing method of semiconductor devices, comprising the steps of: forming a pattern portion containing an internal wiring layer on a semiconductor substrate; forming an interlayer insulating film on the semiconductor substrate; forming an opening portion in the interlayer insulating film so that the pattern portion and the substrate may be exposed; and forming a sidewall insulating film on the side of the pattern portion appearing in the opening portion.

With this manufacturing method of semiconductor devices, the opening portion is formed in the interlayer insulating film and then, the sidewall insulating film is formed, so that the sidewall insulating film is prevented from being exposed to an etchant used to form the opening portion. As a result, it is possible to prevent the side wall insulating film from thinning.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 1A through 1I are sectional views used to explain a manufacturing method of semiconductor devices according to a first embodiment of the present invention;

FIGS. 2A through 2G are sectional views used to explain a manufacturing method of semiconductor devices according to a second embodiment of the present invention;

FIGS. 4A through 4K are sectional views used to explain a manufacturing method of semiconductor devices according to a fourth embodiment of the present invention;

FIG. 8 is a plan view of a pattern showing the final shape of a dynamic RAM produced by a manufacturing method of semiconductor devices according to a seventh embodiment of the present invention;

FIGS. 9A through 9K are first sectional views used to explain a manufacturing method of semiconductor devices according to the seventh embodiment of the present invention;

FIGS. 10A through 10K are second sectional views used to explain a manufacturing method of semiconductor devices according to the seventh embodiment;

FIGS. 11A through 11K are third sectional views used to explain a manufacturing method of semiconductor devices according to the seventh embodiment.

DETAILED DESCRIPTION OF THE PREFERRED EMBODIMENTS

Figure 1A:
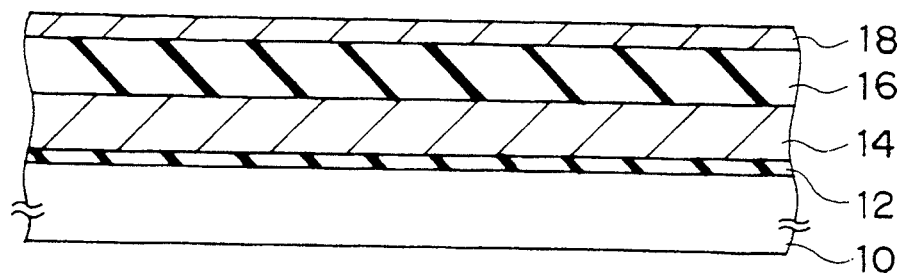

Hereinafter, referring to the accompanying drawings, embodiments of the present invention will be explained. The same parts are indicated by the same reference characters throughout all the drawings, and their repetitive explanation will be omitted.

First explained will be a manufacturing method of semiconductor devices according to a first embodiment of the present invention.

FIGS. 1A through 1I are sectional views used to explain a manufacturing method of semiconductor devices according to a first embodiment of the present invention. FIGS. 1A through 1I show sectional views of an area near the bit line contact portion of a memory cell in a dynamic RAM in the manufacturing sequence.

First, the surface of a p-type silicon substrate is thermally oxidized to form a gate oxide film 12 of approximately 100 angstroms in thickness. Then, using low-pressure CVD techniques (hereinafter, referred to as LPCVD techniques), silicon is deposited on the gate oxide film 12 to form a polysilicon film 14 of approximately 3000 angstroms in thickness. Next, by vapor phase diffusion techniques using a POCl$_3$ source, phosphorus is diffused in the polysilicon film 14 to turn the polysilicon film 14 conductive (into the n-type). Then, using LPCVD techniques, silicon dioxide is deposited on the polysilicon film 14 to deposit a silicon oxide film 16 of approximately 3000 angstroms in thickness. Next, using LPCVD techniques, silicon is deposited on the silicon oxide film 16 to deposit a polysilicon film 18 of approximately 200 angstroms in thickness (FIG. 1A).

Figure 1B:
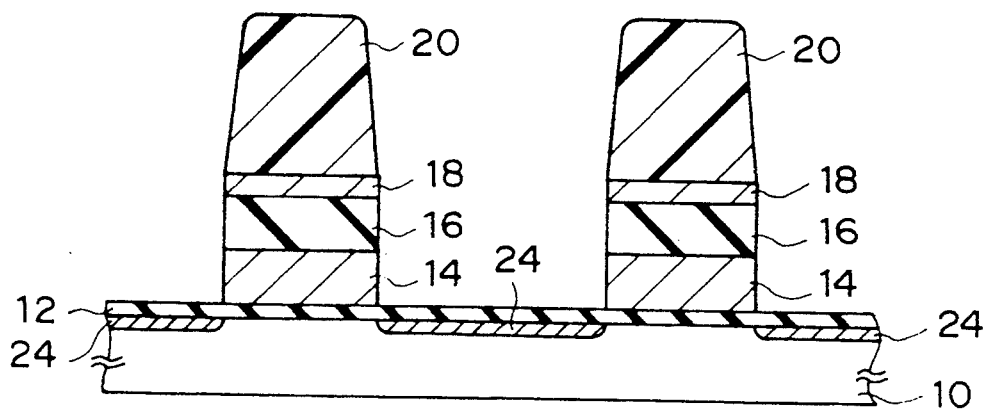

Next, photoresist is applied onto the polysilicon film 18 to form a resist film. Then, using photolithography techniques, the resist film is etched to form a resist pattern 20 corresponding to the gate (word line) pattern. Then, with RIE techniques, using the resist pattern 20 as a mask, the polysilicon film 18, the silicon oxide film 16, the n-type polysilicon film 14, and the gate oxide film 12 are etched in sequence. This provides a wiring layer pat tern 22 containing a gate of the n-type polysilicon film 14, the silicon oxide film 16, and the polysilicon film 18. Then, using the wiring layer pattern 22 as a mask, n-type impurity ions, such as arsenic (As) ions, are injected into the p-type substrate 10 to form an n-type impurity layer 24 serving as the source/drain of a transistor (FIG. 1B).

Figure 1C:
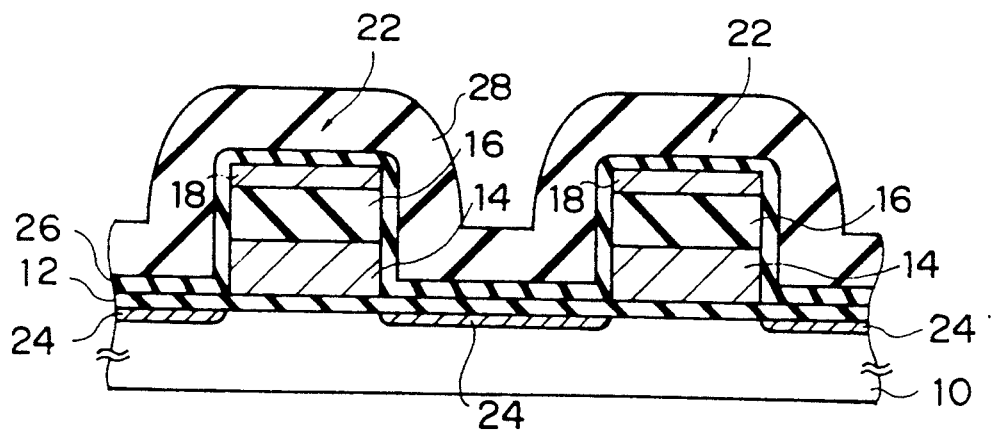

Then, after the resist pattern 20 is removed, silicon dioxide and borophosphosilicate glass (hereinafter, referred to as BPSG) are deposited on the substrate 10 in sequence, using LPCVD techniques, to form a silicon oxide film 26 of approximately 500 angstroms in thickness and a BPSG film 28 of approximately 5000 angstroms in thickness. The silicon oxide film 26 and the BPSG film 28 function as interlayer insulating films (FIG. 1C).

Figure 1D:
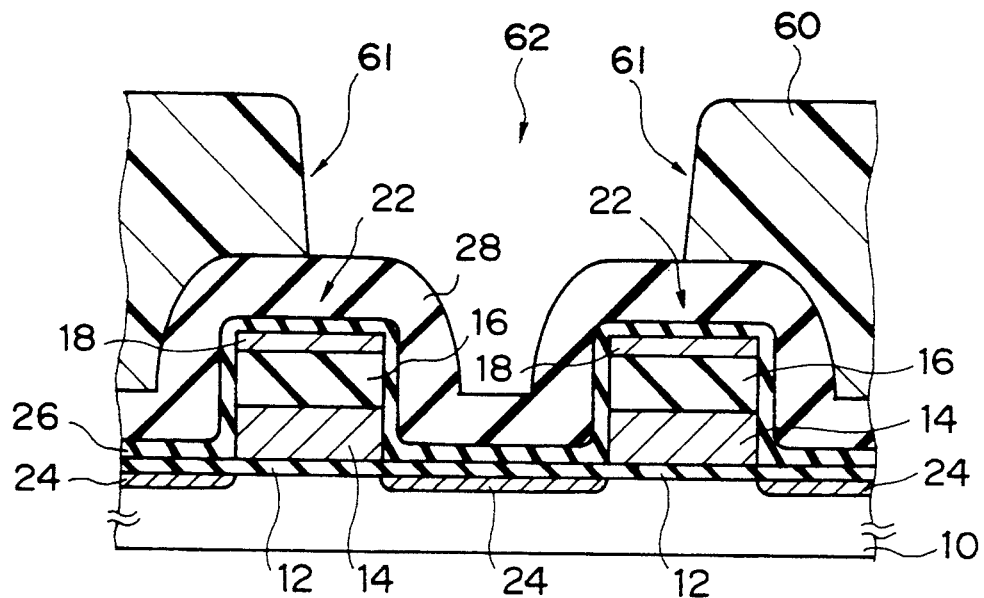

Next, photoresist is applied onto the BPSG film 28 to form a resist film. Then, using photolithography techniques, the resist film is etched to form a resist pattern 60 with a window between and above the wiring patterns 22. At this time, the window 62 is formed, for example, so as to be wider than the distance between the wiring layer patterns 22. As a result, the sidewall 61 of the window 62 is located above the wiring patterns 22 (FIG. 1D).

Figure 1E:
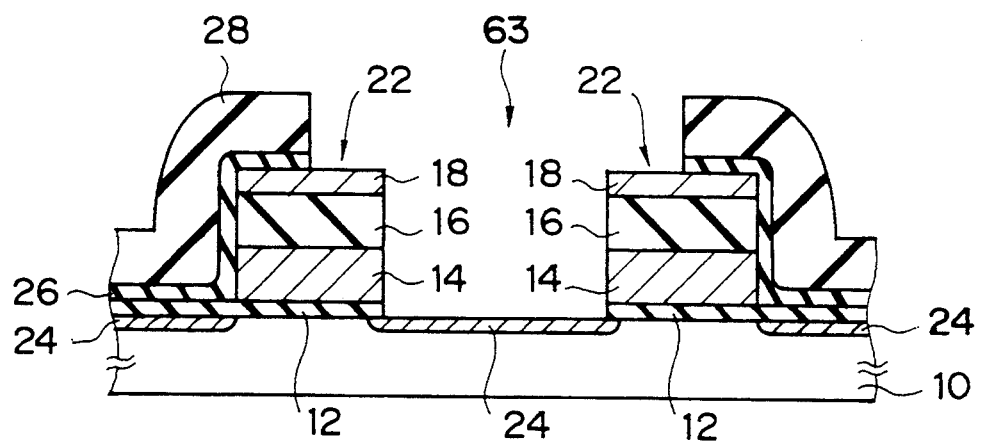

Then, with RIE techniques using, for example, $CHF_3/CO$ ions as an etchant, the BPSG film 28 and the silicon oxide film 26 are etched in sequence with the resist pattern 60 as a mask. This forms an opening portion 63 that leads to the surface of the substrate 10 (the n-type impurity layer 24) between the wiring layer patterns 22. At this time, since the etching speed of polysilicon is as low as less than one-sixtieth that of BPSG and $SiO_2$, the polysilicon film 18 can act as a barrier layer that prevents the progress of etching. In consequence, the silicon oxide film 16 and the n-type polysilicon film (gate) 14 formed below the polysilicon film 18 are not etched. After this, the resist pattern 60 is removed (FIG. 1E).

Next, using hydrogen-burning oxidation techniques at a temperature at least higher than 700° C., for example, at 850° C., the entire polysilicon film 18 is oxidized. This turns the polysilicon film 18 into an oxide ($SiO_2$) 18A, which is an insulator. The BPSG film 28 is allowed to reflow by heat higher than 700° C. in the oxidation process. Further, by the oxidation process, a silicon oxide film ($SiO_2$) 66 of approximately 150 angstroms in thickness is formed on the surface of the substrate 10 (the n-type impurity layer 24 in the figure) appearing in the opening portion 63. On the sidewall of the polysilicon film 14, an oxide 14A is also formed (FIG. 1F).

Next, using LPCVD techniques, silicon nitride ($SiN_X$) is deposited on the substrate 10 to form a silicon nitride film 68 of approximately 2000 angstroms in thickness. The silicon nitride is also deposited on the silicon oxide film 66 or on the sidewall of the wiring layer pattern 22, with the result that the silicon nitride film 68 is also formed inside the opening portion 63 (FIG. 1G).

Figure 1H:
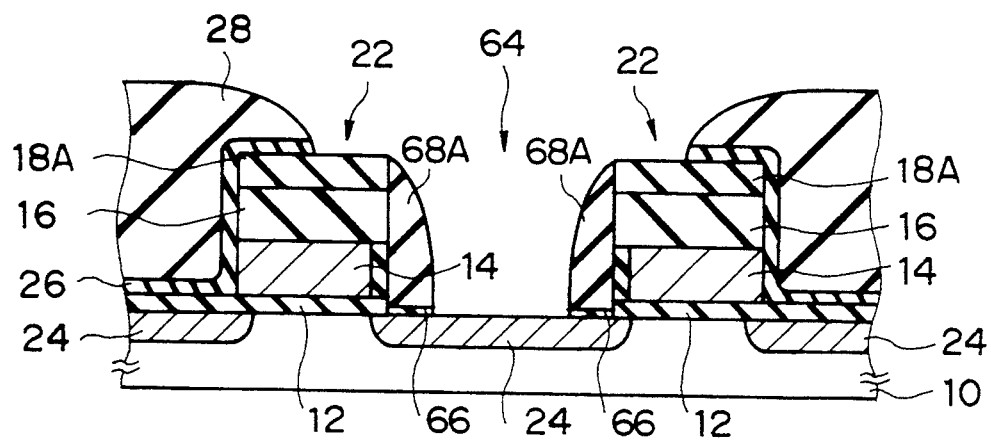

Then, using RIE techniques, the silicon nitride film 68 is etched back to form a contact window 64. Since the RIE technique, a type of anisotropic etching, permits the silicon nitride film 68 to remain on the sidewall of the wiring layer pattern 22, a sidewall insulating film 68A of silicon nitride can be obtained on the sidewall of the wiring layer pattern 22. Also in this etching process, because the silicon oxide film 66 is removed, the surface of the substrate 10 (the n-type impurity layer 24 in the figure) appears in a contact window 64 (FIG. 1H).

Next, using sputtering techniques, a copper-containing aluminium alloy is sputtered on the substrate 10 to form an aluminium alloy film. Then, using photolithography techniques, a resist pattern (not shown) having wiring patterns including bit lines is formed. Then, using RIE techniques, the aluminium alloy film is etched with the not-shown resist pattern as a mask to form an internal wiring layer 70 for bit lines. After this, the not-shown resist pattern is removed (FIG. 1G).

With such a manufacturing method, since the sidewall insulating film 68A is formed after the formation of the opening portion 63, the sidewall insulating film 68A is prevented from being exposed to an etchant for forming the opening portion 63. This prevents the sidewall insulating film 68A from thinning, thereby avoiding the degradation of the insulating properties of the sidewall insulating film 68A. For example, in the bit-line contact portion of a memory cell, the insulation between the bit line (reference numeral 70) and the word line (reference numeral 14) of a memory cell transistor is improved, so that the memory cells can be made still smaller without degrading the insulation.

Next explained will be a manufacturing method of semiconductor devices according to a second embodiment of the present invention.

FIGS. 2A through 2G are sectional views used to explain a manufacturing method of semiconductor devices according to a second embodiment of the present invention. FIGS. 2A through 2G show sectional views of a portion near the bit line contact portion of a memory cell in a dynamic RAM in the manufacturing sequence.

First, according to a manufacturing method explained in FIGS. 1A through 1C, a structure shown in FIG. 1C is obtained. Then, the structure of FIG. 1C is annealed in an atmosphere of nitrogen of 850° C. to allow the BPSG film to reflow. This smooths the surface of the BPSG film 28 (FIG. 2A).

Next, using a similar manufacturing method to that explained in FIG. 1D, a resist pattern 60 having a window 62 is formed on the BPSG film 28. At this time, the window 62 is made wider than, for example, the distance between the wiring layer patterns 22. As a result, the sidewall 61 of the window 62 is located above the wiring layer patterns 22 (FIG. 2B).

Next, using a similar manufacturing method to that explained in FIG. 1E, an opening portion 63 is formed which leads to the surface of the substrate 10 (the n-type impurity layer 24 in the figure) between the wiring layer patterns 22.

Figure 2C:
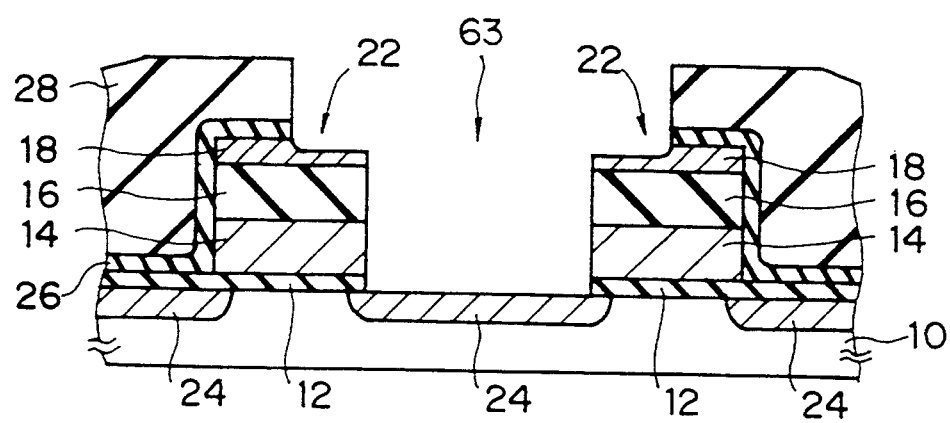
Figure 2D:
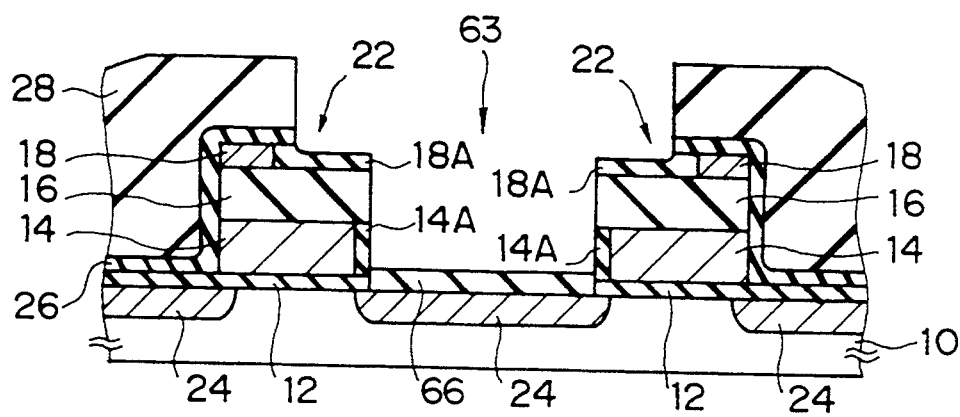

Then, using hydrogen-burning oxidation techniques at 850° C., the polysilicon film 18 is oxidized from the opening portion 63. This turns at least the polysilicon film 18 appearing in the opening portion 63 into an oxide ($SiO_2$) 18A, an insulator. By this oxidation process, a silicon oxide film ($SiO_2$) 66 of approximately 150 angstroms in thickness is formed on the surface of the substrate 10 (the n-type impurity layer 24 in the figure)

appearing in the opening portion 63. Further, an oxide 14A is also formed on the sidewall of the polysilicon film 14 (FIG. 2D).

Figure 2E:
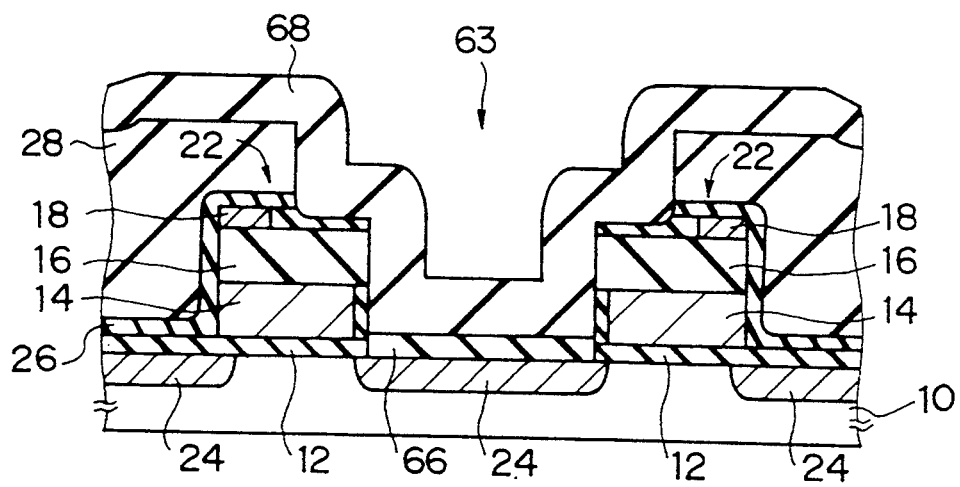

Next, using a similar manufacturing method to that explained in FIG. 1G, the silicon nitride film 68 is formed on the substrate 10. At this time, the silicon nitride film 68 is also formed inside the opening portion 63 (FIG. 2E).

Figure 2F:
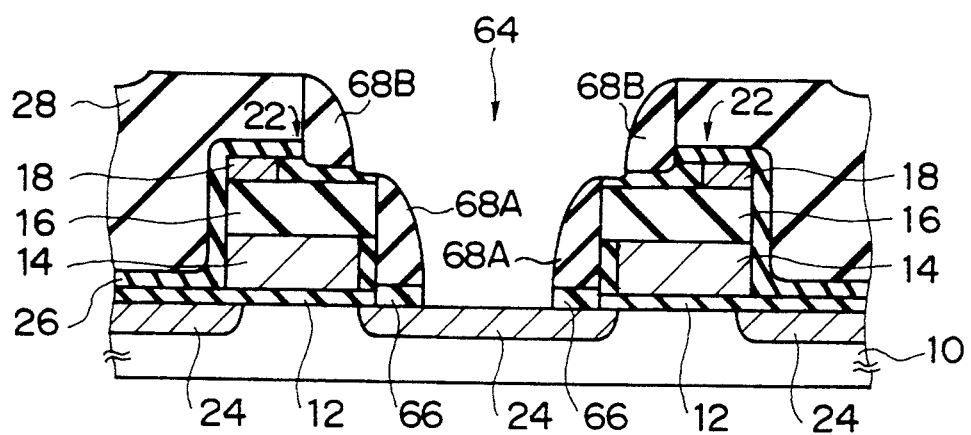

Then, using RIE techniques, the silicon nitride film 68 is etched back to form a contact window 64. Since the RIE technique allows the silicon nitride film 68 to remain on the sidewall of the wiring layer pattern 22 and the sidewall of the BPSG film 28, sidewall insulating films 68A and 68B of silicon nitride can be obtained on the sidewalls of the wiring layer pattern 22 and the BPSG film 28. Further, by this etching process, the silicon oxide film 66 is removed, so that the surface of the substrate 10 (the n-type impurity layer 24 in the figure) appears in the contact window 64 (FIG. 2F).

Figure 1I:
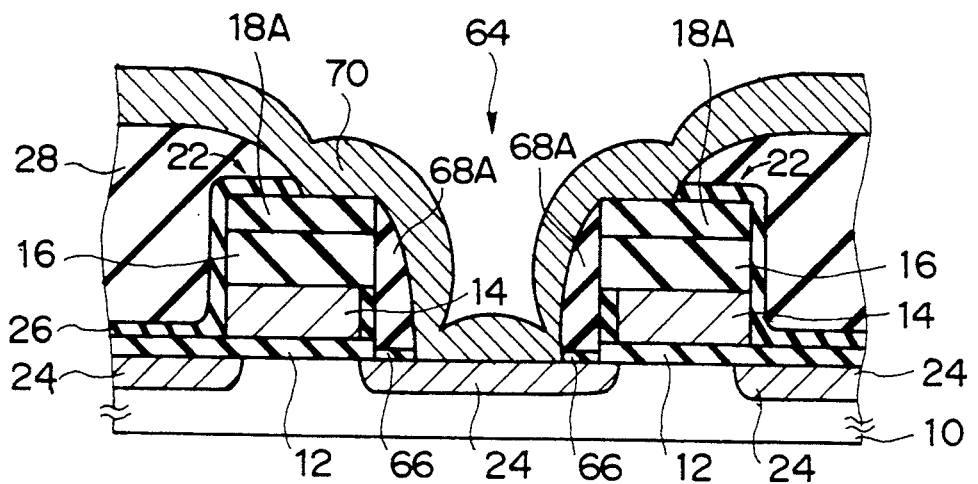
Figure 2G:
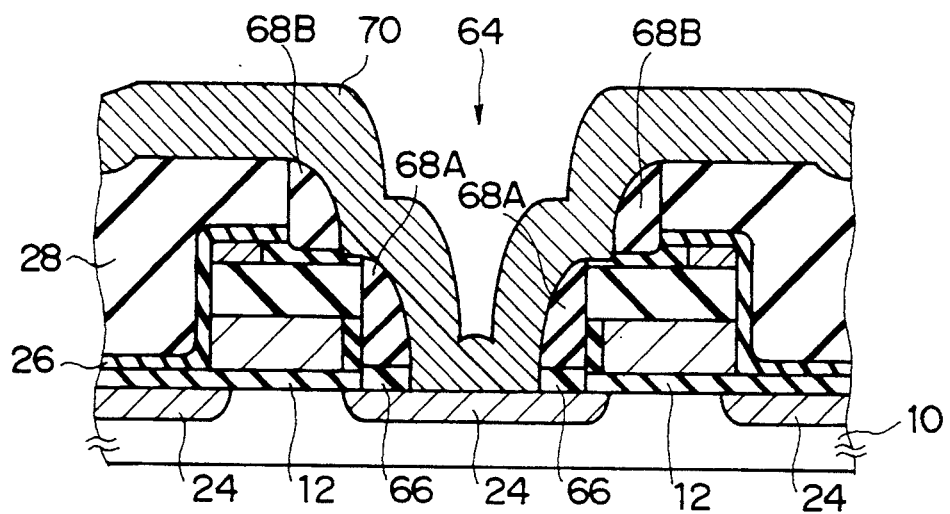

Next, using a similar manufacturing method to that explained in FIG. 1I, an internal wiring layer 70 for bit lines and others is formed which is electrically connected to the n-type impurity layer 24 via the contact window 64 (FIG. 2G).

In this way, the BPSG film 28 may be allowed to reflow before the formation of the contact window 64. Additionally, the entire polysilicon film 18 is not necessarily oxidized, but at least the polysilicon film 18 appearing in the opening portion 63 may be turned into the oxide 18A.

Figure 3F:
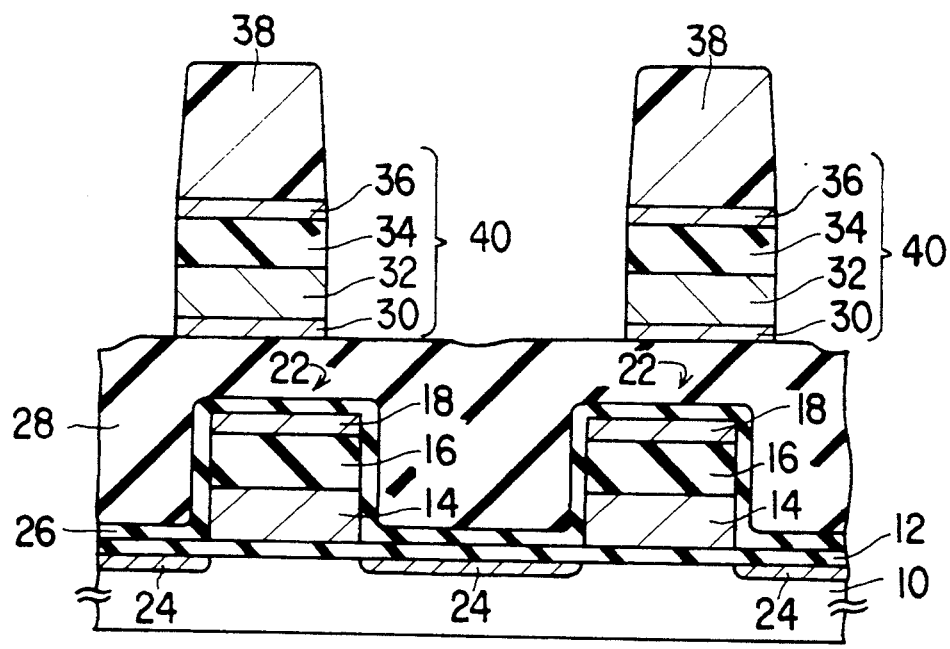
FIGS. 3A through 3N are sectional views used to explain a manufacturing method of semiconductor devices according to a third embodiment of the present invention.
Figure 3G:
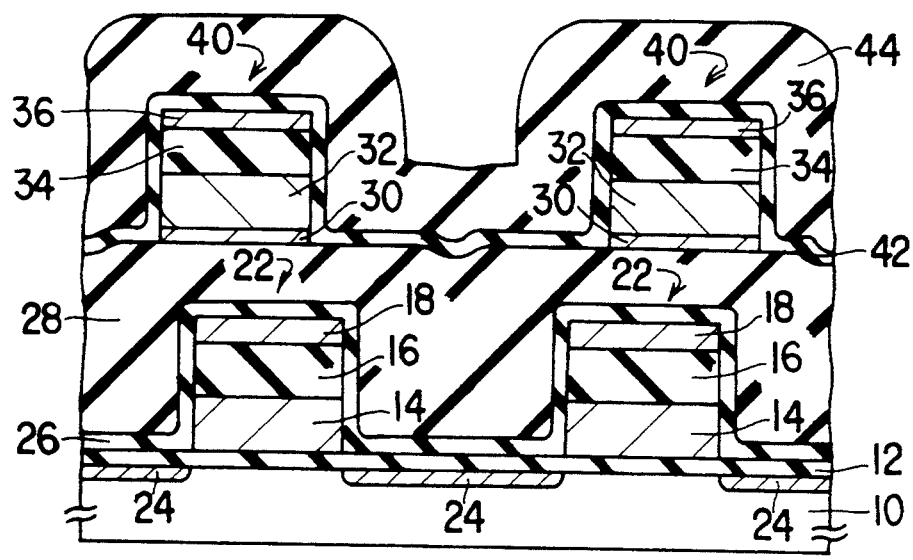
Figure 3J:
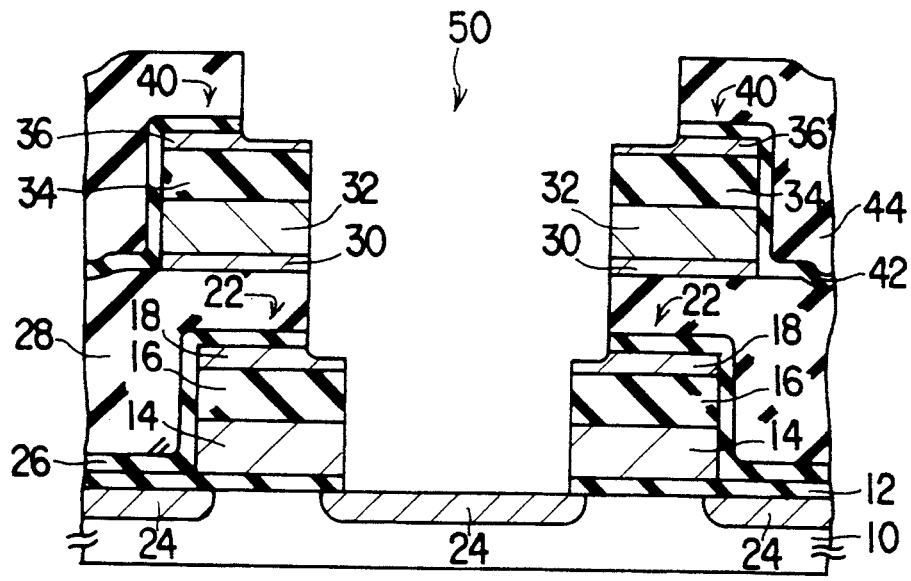
Figure 3K:
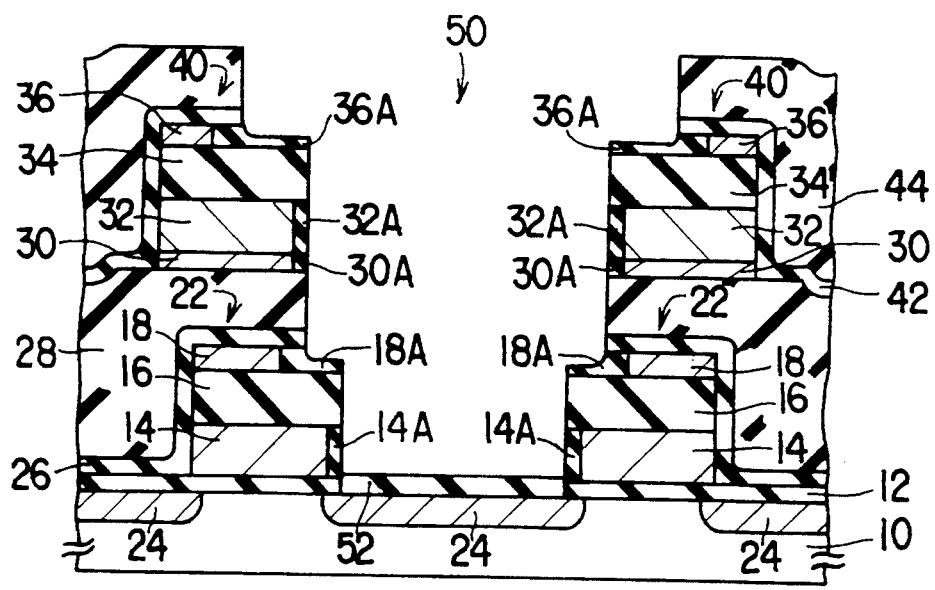
Figure 3L:
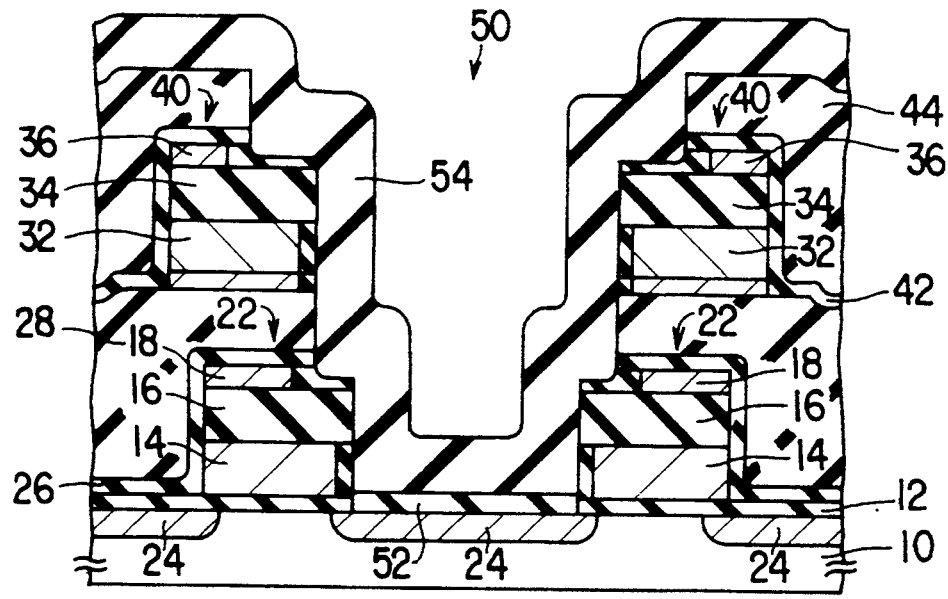
Figure 3M:
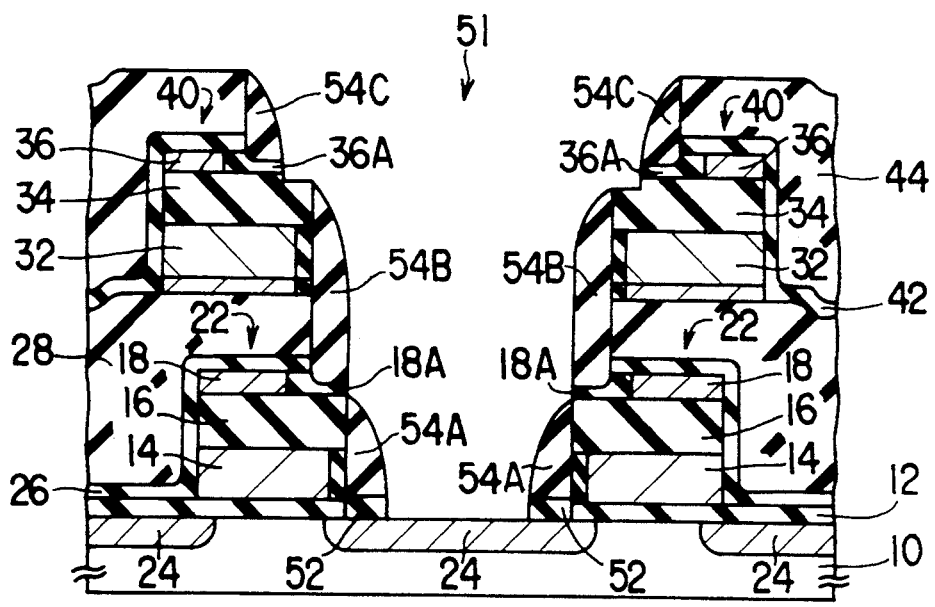
Figure 3N:
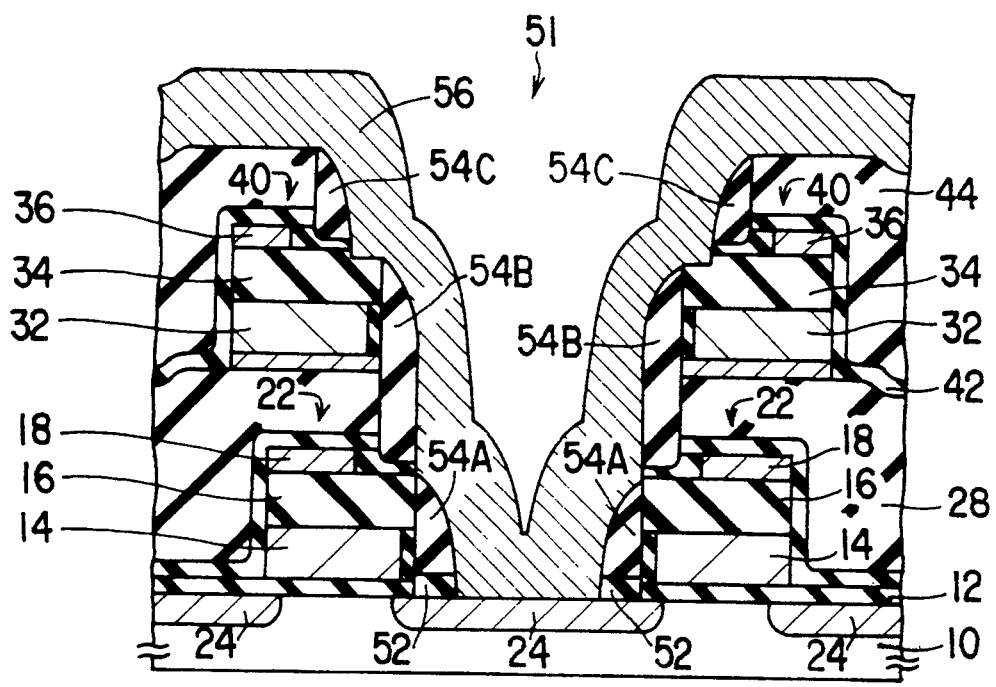

FIGS. 3A through 3N are sectional views used to explain a manufacturing method of semiconductor devices according to a third embodiment of the present invention.

First, the surface of a p-type silicon substrate 10 is thermally oxidized to form a gate oxide film 12 of approximately 200 angstroms in thickness. Then, using low-pressure CVD techniques (hereinafter, referred to as LPCVD techniques), silicon is deposited on the gate oxide film 12 to form a polysilicon film 14 of approximately 3000 angstroms in thickness. Next, by vapor phase diffusion techniques using a $POCl_3$ source, phosphorus is diffused in the polysilicon film 14 to turn the polysilicon film 14 conductive (into the n-type). Then, using LPCVD techniques, silicon dioxide is deposited on the polysilicon film 14 to deposit a silicon oxide film 16 of approximately 3000 angstroms in thickness. Next, using LPCVD techniques, silicon is deposited on the silicon oxide film 16 to deposit a polysilicon film 18 of approximately 200 angstroms in thickness (FIG. 3A).

Next, photoresist is applied onto the polysilicon film 18 to form a resist film. Then, using photolithography techniques, the resist film is etched to form a resist pattern 20 corresponding to a first-level wiring layer pattern (for example, a word line pattern). Then, using RIE techniques, the polysilicon film 18, the silicon oxide film 16, the n-type polysilicon film 14, and the gate oxide film 12 are etched in sequence with the resist pattern 20 as a mask. This provides a first-level wiring layer pattern 22 containing a gate of the n-type polysilicon film 14, the silicon oxide film 16, and the polysilicon film 18. Then, using the first-level wiring layer pattern 22 as a mask, n-type impurity ions, such as arsenic (As) ions, are injected into the p-type substrate 10 to form an n-type impurity layer 24 serving as the source/drain of a transistor (FIG. 3B).

Then, after the resist pattern 20 is removed, silicon dioxide and BPSG are deposited on the substrate 10 in sequence, using LPCVD techniques, to form a silicon oxide film 26 of approximately 500 angstroms in thickness and a BPSG film 28 of approximately 5000 angstroms in thickness. The silicon oxide film 26 and the BPSG film 28 function as interlayer insulating films (FIG. 3C).

Then, the structure shown in FIG. 3C is annealed in an atmosphere of nitrogen of 850° C. to allow the BPSG film 28 to reflow. This smooths the surface of the BPSG film 28 (FIG. 3D).

Then, using LPCVD techniques, silicon is deposited on the BPSG film 28 to form a polysilicon film 30 of approximately 1000 angstroms in thickness. Next, by vapor phase diffusion techniques using a $POCl_3$ source, phosphorus is diffused in the polysilicon film 30 to turn the polysilicon film 30 conductive (into the n-type). Then, using DC magnetron spattering techniques, tungsten silicide ($WSi_2$) is deposited on the n-type polysilicon film 30 to form a tungsten silicide film 32 of approximately 2000 angstroms in thickness. Then, using LPCVD techniques, silicon dioxide is deposited on the tungsten silicide film 32 to form a silicon oxide film 34 of approximately 3000 angstroms in thickness. Then, using LPCVD techniques, silicon is deposited on the silicon oxide film 34 to form a polysilicon film 36 of approximately 500 angstroms in thickness (FIG. 3E).

Next, photoresist is applied onto the polysilicon film 36 to form a resist film. Then, using photolithography techniques, the resist film is etched to form a resist pattern 38 corresponding to a second-level wiring layer pattern. Then, using RIE techniques, the polysilicon film 36, the silicon oxide film 34, the tungsten silicide film 32, and the n-type polysilicon film 30 are etched sequentially with the resist pattern 38 as a mask. This provides a second-level wiring layer pattern 40 that contains a second-level wiring layer whose main conducting element is the tungsten silicide film 32, the silicon oxide film 34 and the polysilicon film 36 (FIG. 3F).

Then, after the resist pattern 38 is removed, silicon dioxide and BPSG are deposited on the substrate 10 in sequence, using LPCVD techniques, to form a silicon oxide film 42 of approximately 500 angstroms in thickness and a BPSG film 44 of approximately 7000 angstroms in thickness. The silicon oxide film 42 and the BPSG film 44 function as interlayer insulating films (FIG. 3G).

Then, the structure shown in FIG. 3G is annealed in an atmosphere of nitrogen of 850° C. to allow the BPSG film 44 to reflow. This smooths the surface of the BPSG film 44 (FIG. 3H).

Next, photoresist is applied onto the BPSG film 44 to form a resist film. Then, using photolithography techniques, the resist film is etched to form a resist pattern 46 having a window 48 between and above the second-level wiring layer patterns 40. At this time, the window 48 is made, for example, so as to be located in the area containing a planned contact portion to the substrate 10 and be wider than the distance between the second-level wiring layer patterns 40. As a result, the sidewall 47 of the window 48 is located above the second-level wiring layer patterns 40 (FIG. 3I).

Then, with RIE techniques using $CHF_3$ ions as an etchant, the BPSG film 44, the silicon oxide film 42, the BPSG film 28, the silicon oxide film 26, and the gate oxide film 12 are etched sequentially with the resist pattern 46 as a mask. This forms an opening portion 50 that leads to the surface of the substrate 10 (the n-type impurity layer 24 in the figure) between the second-level wiring layer patterns 40 and between the first-level wiring layer patterns 22. The etching on the second-level wiring layer pattern 40 is ceased when the polysilicon film 36 is etched, for example, approximately 400 angstroms. The etching on the first-level wiring layer pattern 22 is stopped when the polysilicon film 18 is etched, for example, approximately 200 angstroms. This is because the etching speed of polysilicon is as low as less than one-sixtieth that of BPSG and $SiO_2$, which enables the polysilicon films 18 and 36 to act as barrier layers that prevent the progress of etching. After this, the resist pattern 46 is removed (FIG. 3J).

Then, using hydrogen-burning oxidation techniques at 850° C., the polysilicon films 18 and 36 are oxidized from the opening portion 50. This turns at least the polysilicon films 18 and 36 appearing in the opening portion 50 into oxides ($SiO_2$) 18A and 36A, respectively, which are insulators. By this oxidation process, a silicon oxide film ($SiO_2$) 52 of approximately 150 angstroms in thickness is formed on the surface of the substrate 10 (the n-type impurity layer 24 in the figure) appearing in the opening portion 50. Further, oxides 14A, 30A, and 32A are also formed on the sidewalls of the polysilicon film 14, the polysilicon film 30, and the tungsten silicide film 32, respectively (FIG. 3K).

Next, using LPCVD techniques, silicon nitride ($SiN_X$) is deposited on the substrate 10 to form a silicon nitride film 54 of approximately 2000 angstroms in thickness. Because silicon nitride is also deposited on the silicon oxide film 52, and the sidewalls of the first-level wiring layer pattern 22, the second-level wiring layer pattern 40, and the opening section 50, the silicon nitride film 54 is also formed inside the opening portion 50 (FIG. 3L).

Then, using RIE techniques, the silicon nitride film 54 is etched back to form a contact window 51. Since the RIE technique, a type of anisotropic etching, permits the silicon nitride film 54 to remain on the sidewalls of the first-level wiring layer pattern 22, the BPSG film 28, the second-level wiring layer pattern 22, and the BPSG film 44, the sidewall insulating films 54A through 54C of silicon nitride can be obtained. Also in this etching process, because the silicon oxide film 52 is removed, the surface of the substrate 10 (the n-type impurity layer 24 in the figure) appears in the contact window 51. By this etching process, the oxides 18A and 36A can be etched away completely. Because both the silicon oxide films 16 and 34 have a sufficient thickness, however, etching cannot reach the polysilicon film (the first-level wiring layer) 14 and the polysilicon film (the second-level wiring layer) 32 (FIG. 3M).

Then, while phosphorus is being doped using LPCVD techniques, silicon is deposited on the substrate 10 to form a conductive (n-type) polysilicon film of approximately 3000 angstroms in thickness. Next, using photolithography techniques, a resist pattern (not shown) having a third-level wiring pattern is formed. Then, using RIE techniques, the polysilicon film is etched with the not-shown resist pattern as a mask to form a third-level wiring layer 56. After this, the not-shown resist pattern is removed (FIG. 3N).

FIGS. 4A through 4K are sectional views used to explain a manufacturing method of semiconductor devices according to a fourth embodiment of the present invention.

First, according to the manufacturing method explained in FIGS. 3A through 3D, a structure as shown in FIG. 3D is obtained (FIG. 4A).

Then, using LPCVD techniques, silicon is deposited on the BPSG film 28 to form a polysilicon film 30 of approximately 1000 angstroms in thickness. Next, by vapor phase diffusion techniques using a $POCl_3$ source, phosphorus is diffused in the polysilicon film 30 to turn the polysilicon film 14 conductive (into the n-type). Then, using DC magnetron spattering techniques, tungsten silicide ($WSi_2$) is deposited on the n-type polysilicon film 30 to form a tungsten silicide film 32 of approximately 2000 angstroms in thickness (FIG. 4B).

Figure 4C:
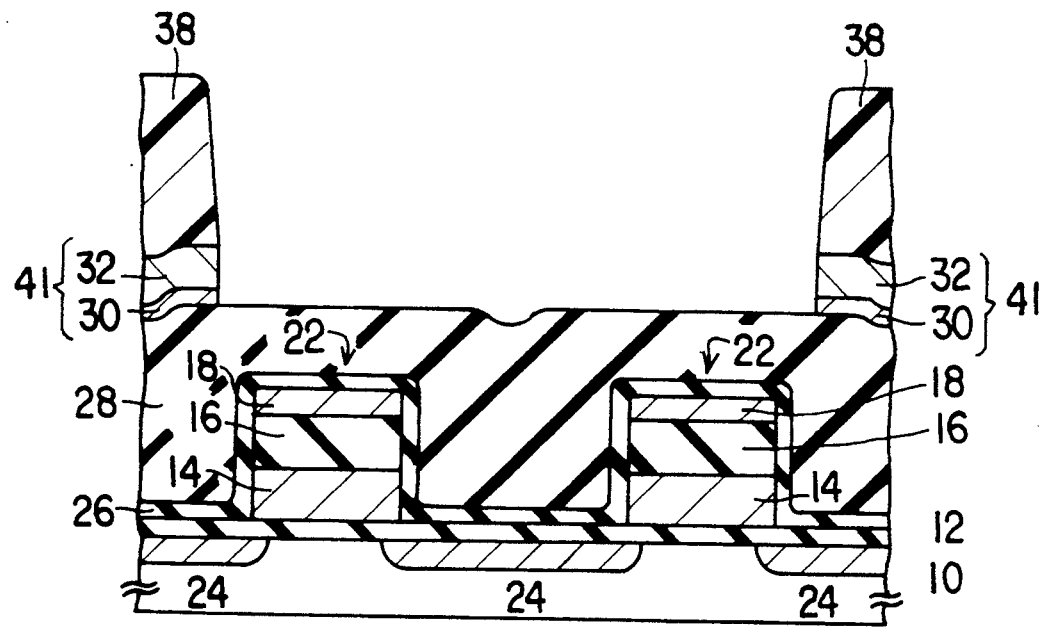

Next, photoresist is applied onto the tungsten silicide film 32 to form a resist film. Then, using photolithography techniques, the resist film is etched to form a resist pattern 38 corresponding to a second-level wiring layer pattern. Then, using RIE techniques, the tungsten silicide film 32 and the n-type polysilicon film 30 are etched in sequence with the resist pattern 38 as a mask. This provides a second-level wiring layer pattern 41 containing a second-level wiring layer whose main conducting element is the tungsten silicide film 32 (FIG. 4C).

Then, after the resist pattern 38 is removed, silicon dioxide and BPSG are deposited on the substrate 10 in sequence, using LPCVD techniques, to form a silicon oxide film 42 of approximately 500 angstroms in thickness and a BPSG film 44 of approximately 7000 angstroms in thickness. The silicon oxide film 42 and the BPSG film 44 function as interlayer insulating films (FIG. 4D).

Figure 4D:
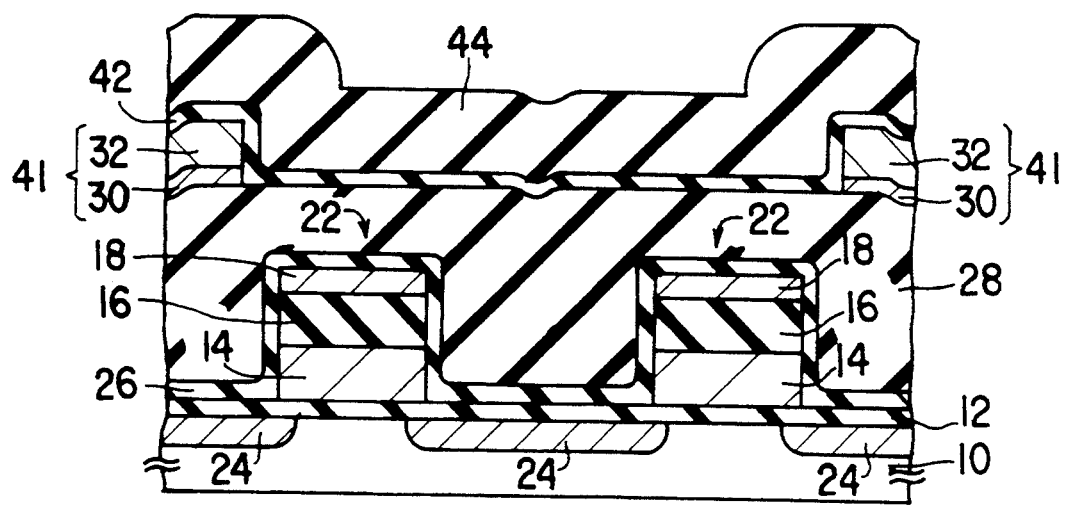
Figure 4E:
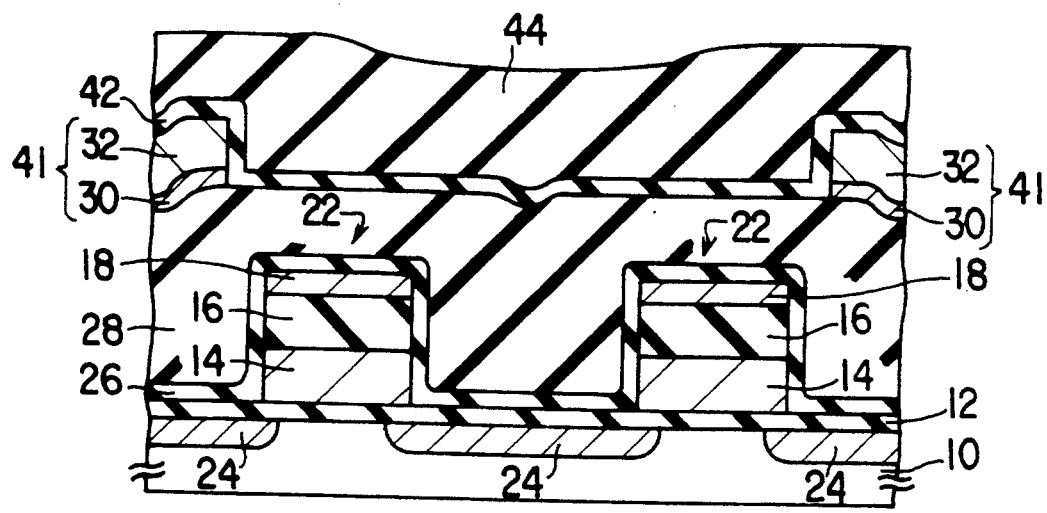

Then, the structure shown in FIG. 4D is annealed in an atmosphere of nitrogen of 850° C. to allow the BPSG film 44 to reflow. This smooths the surface of the BPSG film 44 (FIG. 4E).

Figure 4F:
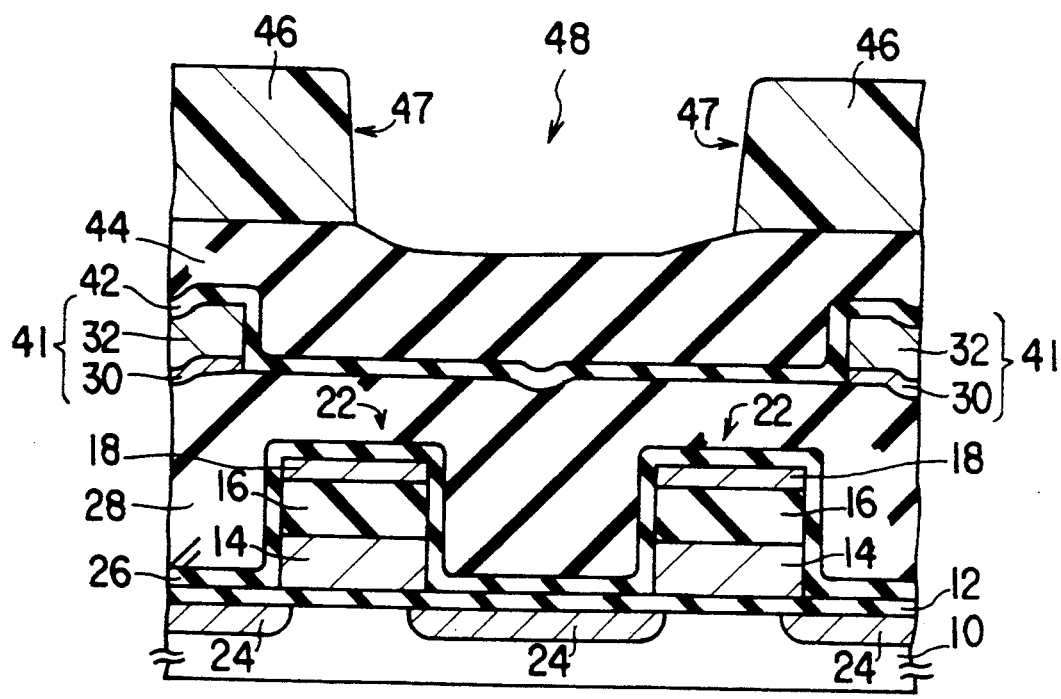

Next, photoresist is applied onto the BPSG film 44 to form a resist film. Then, using photolithography techniques, the resist film is etched to form a resist pattern 46 having a window 48 between and above the second-level wiring patterns 41. At this time, the window 48 is made, for example, so as to be located in the area containing a planned contact portion to the substrate and be narrower than the distance between the second-level wiring layer patterns 41 and wider than the distance between the first-level wiring layer patterns 22. As a result, the sidewall 47 of the window 48 is located above the first-level wiring layer patterns 22 (FIG. 4F).

Figure 4G:
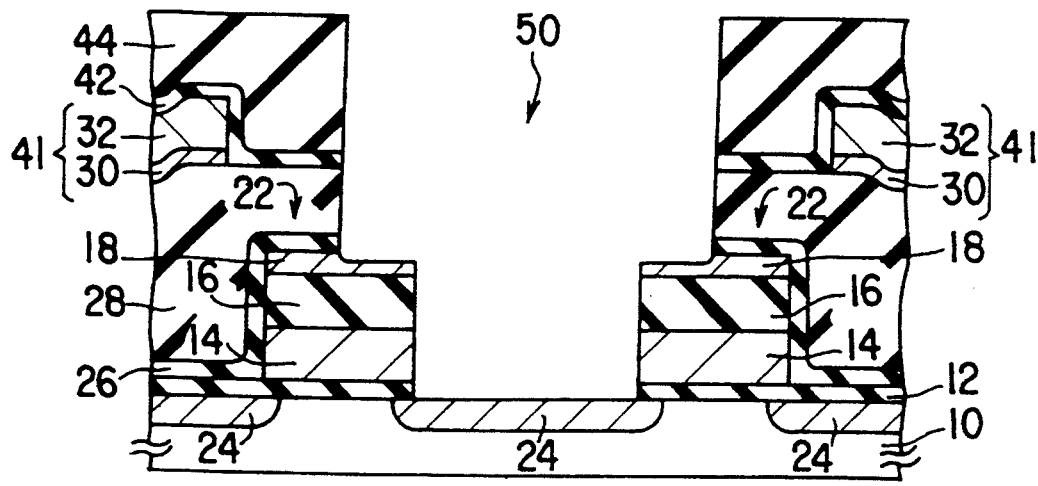

Then, using RIE techniques with $CHF_3$ ions as an etchant, the BPSG film 44, the silicon oxide film 42, the BPSG film 28, the silicon oxide film 26, and the gate oxide film 12 are etched sequentially with the resist pattern 46 as a mask. This forms an opening portion 50 that leads to the surface of the substrate 10 (the n-type impurity layer 24 in the figure) between the second-level wiring layer patterns 40 and between the first-level wiring layer patterns 22. At this time, because the etching speed of polysilicon is as low as less than one-sixtieth that of BPSG and $SiO_2$, the polysilicon film 18 can act as a barrier layer that prevents the progress of etching. Hence, the etching on the first-level wiring layer pattern 22 is ceased when the polysilicon film 18 is etched, for example, approximately 200 angstroms. After this, the resist pattern 46 is removed (FIG. 4G).

Figure 4H:
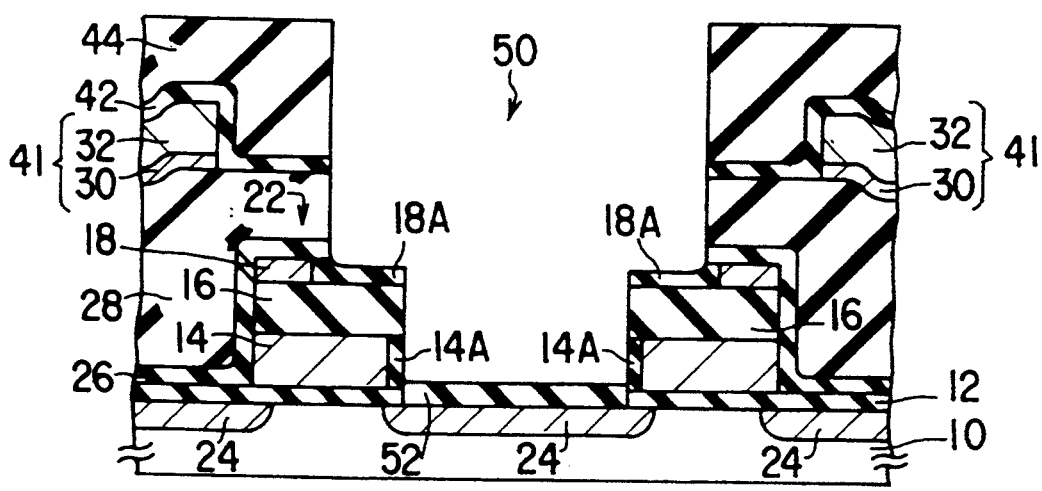

Then, using hydrogen-burning oxidation techniques at 850° C., the polysilicon film 18 is oxidized from the opening portion 50. This turns at least the polysilicon film 18 appearing in the opening portion 50 into an oxide (SiO$_2$) 18A, an insulator. By this oxidation process, a silicon oxide film (SiO$_2$) 52 of approximately 150 angstroms in thickness is formed on the surface of the substrate 10 (the n-type impurity layer 24 in the figure) appearing in the opening portion 50. Further, an oxide 14A is also formed on the sidewall of the polysilicon film 14 (FIG. 4H).

Figure 4I:
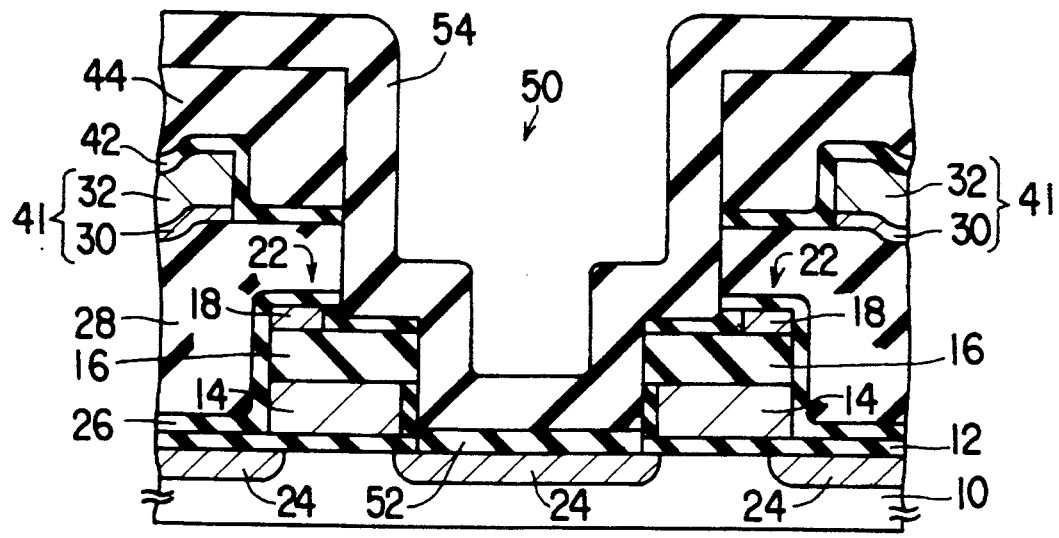

Next, using LPCVD techniques, silicon nitride (SiN$_X$) is deposited on the substrate 10 to form a silicon nitride film 54 of approximately 2000 angstroms in thickness. Because silicon nitride is also deposited on the silicon oxide film 52, the sidewall of the first-level wiring layer pattern 22, and the sidewall of the opening portion 50, the silicon nitride film 54 is also formed inside the opening portion 50 (FIG. 4I).

Figure 4J:
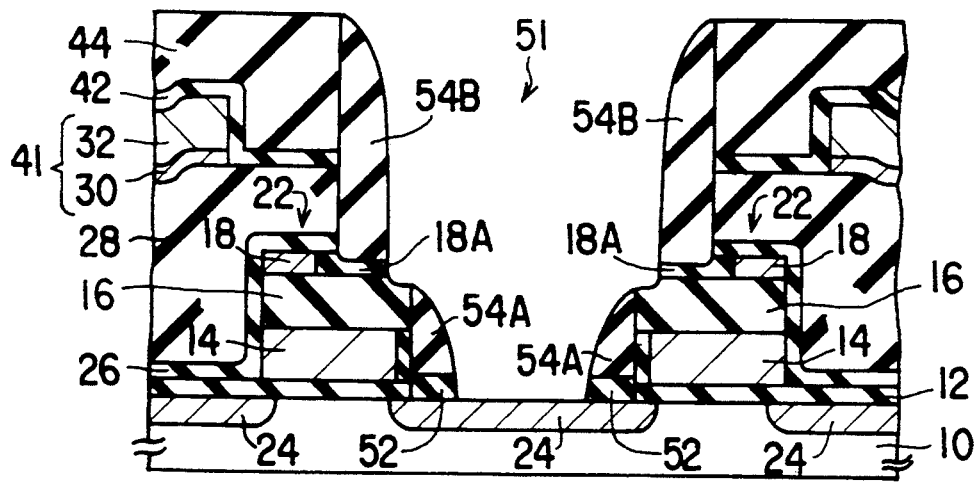

Then, by the same manufacturing method explained in FIG. 3, the silicon nitride film 54 is etched back to form a contact window 51. Since the silicon nitride film 54 is allowed to remain on the sidewalls of the first-level wiring layer pattern 22, the BPSG film 28, and the BPSG film 44, the sidewall insulating films 54A and 54B of silicon nitride can be obtained. Also in this etching process, because the silicon oxide film 52 is removed, the surface of the substrate 10 (the n-type impurity layer 24 in the figure) appears in the contact window 51. By this etching process, the oxide 18A can be etched away completely. Because the silicon oxide film 16 has a sufficient thickness, however, etching cannot reach the polysilicon film (the first-level wiring layer) 14 (FIG. 4J).

Figure 4K:
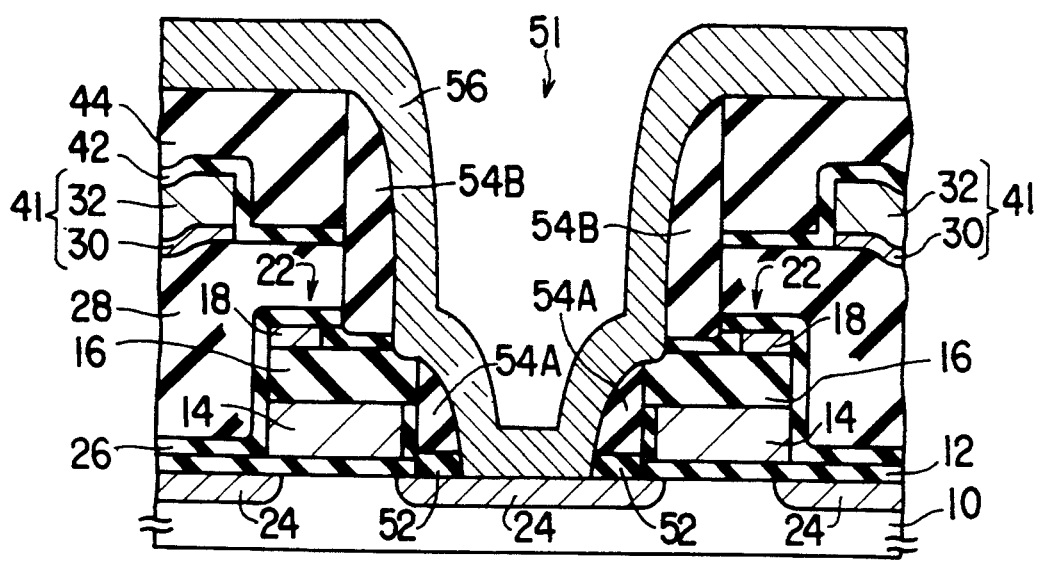

Then, while phosphorus is being doped using LPCVD techniques, silicon is deposited on the substrate 10 to form a conductive (n-type) polysilicon film of approximately 3000 angstroms in thickness. Next, using photolithography techniques, a resist pattern (not shown) having a third-level wiring pattern is formed. Then, using RIE techniques, the polysilicon film is etched with the not-shown resist pattern as mask to form a third-level wiring layer 56. After this, the not-shown resist pattern is removed (FIG. 4K).

Figure 5:
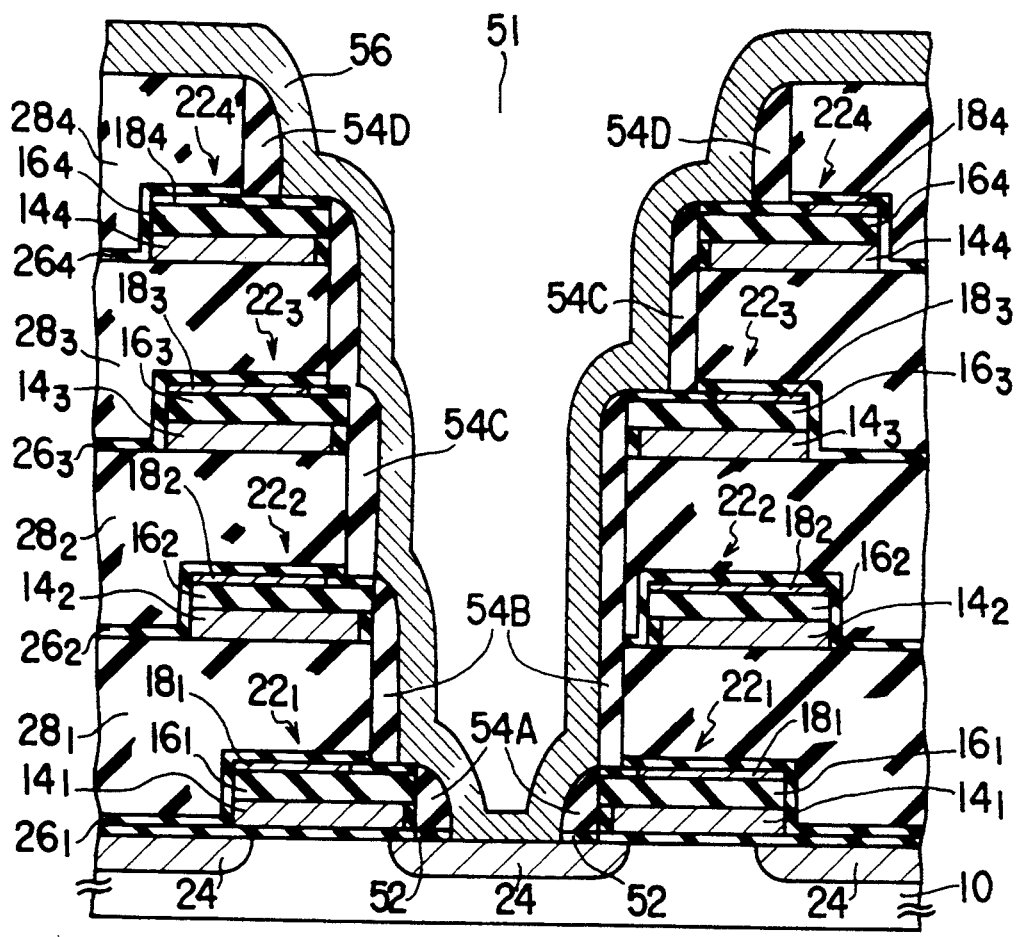
FIG. 5 is a sectional view showing the final shape of a semiconductor devices produced by a manufacturing method of semiconductor devices according to a fifth embodiment of the present invention.

FIG. 5 is a sectional view showing the final shape of a semiconductor device produced according to a manufacturing method of semiconductor devices according to a fifth embodiment of the present invention.

As shown in FIG. 5, it is possible to form a contact window 51 in a semiconductor device with three or more wiring layers by combining the methods explained in the first and second embodiments.

In FIG. 5, reference symbol 22$_1$ indicates a first pattern portion containing a first-level wiring layer 14$_1$. Similarly, reference symbol 22$_2$ denotes a second pattern portion containing a second-level wiring layer 14$_2$; 22$_3$ a third pattern portion containing a third-level wiring layer 14$_3$; and 22$_4$ a fourth pattern portion containing a fourth level wiring layer 14$_4$. The silicon oxide film 16$_1$ and the polysilicon film 18$_1$ contained in the first pattern portion 22$_1$ function as barrier layers that prevent the progress of etching in forming an opening portion. Similarly, the silicon oxide film 16$_2$ and the polysilicon film 18$_2$ contained in the second pattern portion 22$_2$ function as barrier layers that prevent the progress of etching in forming an opening portion; the silicon oxide film 16$_3$ and the polysilicon film 18$_3$ contained in the third pattern portion 22$_3$ function as barrier layers that prevent the progress of etching in forming an opening portion; and the silicon oxide film 16$_4$ and the polysilicon film 18$_4$ contained in the fourth pattern portion 22$_4$ function as barrier layers that prevent the progress of etching in forming an opening portion. Reference symbol 28$_1$ indicates an interlayer insulating film (composed of, for example, BPSG) that insulates the first-level wiring layer 14$_1$ and the second-level wiring layer 14$_2$ from each other. Similarly, reference symbol 28$_2$ denotes an interlayer insulating film that insulates the second-level wiring layer 14$_2$ and the third-level wiring layer 14$_3$ from each other; 28$_3$ an interlayer insulating film that insulates the third-level wiring layer 14$_3$ and the fourth-level wiring layer 14$_4$ from each other; and 28$_4$ an interlayer insulating film that insulates the fourth-level wiring layer 14$_4$ and the fifth-level wiring layer 56 from each other. Reference symbols 54A through 54D represent the sidewall insulating films (composed of, for example, Si$_3$N$_4$ or SiO$_2$) formed on the sidewalls of the interlayer insulating films 28$_1$ through 28$_4$ and above the sidewalls of the wiring layers 14$_1$ through 14$_4$.

In the semiconductor device of FIG. 5, the internal wiring layers are formed into a multilayer structure, so that the contact window 51 becomes deeper. For this reason, it is desirable that the barrier layers should be thicker as they are closer to the final-level layer. That is, the second-level barrier layer is thicker than the first-level one; the third-level barrier layer is thicker than the second-level one; and the fourth-level barrier layer is thicker than the third-level one. With this configuration, for example, even if the fourth-level barrier layer is exposed to an etchant for a long time, the barrier layer remains, with the result that the fourth-level wiring layer 14$_4$ is prevented from being etched. In one example of this method, the relationship between the thickness of polysilicon films 18$_1$ through 18$_4$ is set up as follows:

$$T18_1 < T18_2 < T18_3 < T18_4 \qquad (1)$$

where T18$_1$, T18$_2$, T18$_3$, and T18$_4$ indicate the thickness of polysilicon films 18$_1$, 18$_2$, 18$_3$, and 18$_4$, respectively.

Next explained will be a manufacturing method of semiconductor devices according to a sixth embodiment of the present invention.

Figure 6:
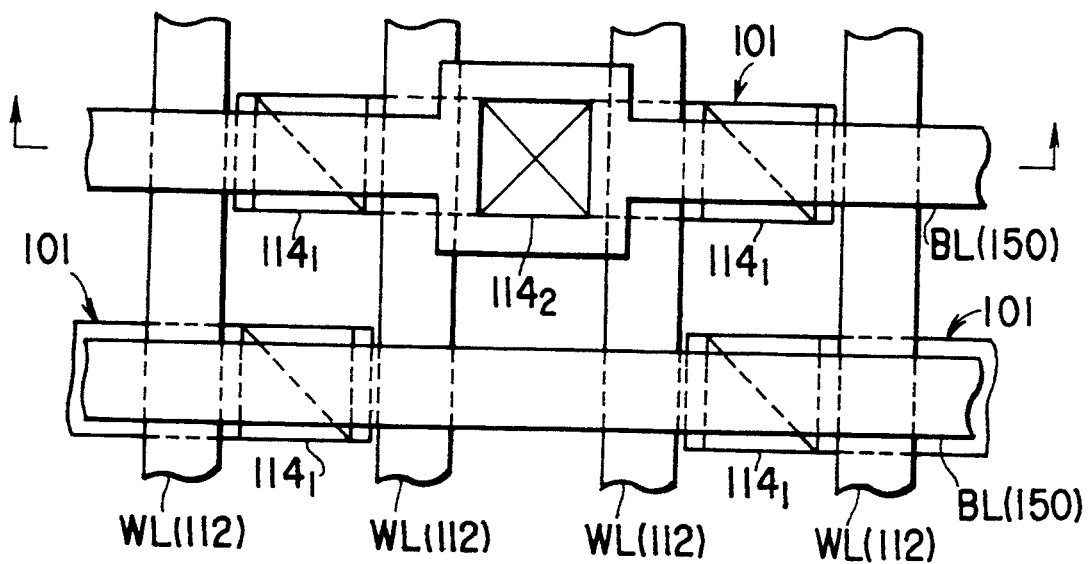
FIG. 6 is a sectional view showing the final shape of a dynamic RAM produced by a manufacturing method of semiconductor devices according to a sixth embodiment of the present invention.

FIG. 6 is a plan view of a pattern showing the final shape of a dynamic RAM produced by a manufacturing method of semiconductor devices according to a sixth embodiment of the present invention.

As shown in FIG. 6, a source region 114$_1$ and a drain region 114$_2$ are formed in an element-formed region 101 where the surface of a silicon substrate appears. On the element-formed region 101 between the source region 114$_1$ and the drain region 114$_2$, a word line (a gate electrode) WL is formed. A bit line BL is electrically connected to the drain region 114$_2$. A storage node electrode is electrically connected to the source region 114$_1$. In FIG. 6, for the sake of clarity, the storage node electrode and the sell plate electrode are omitted.

Figure 7G:
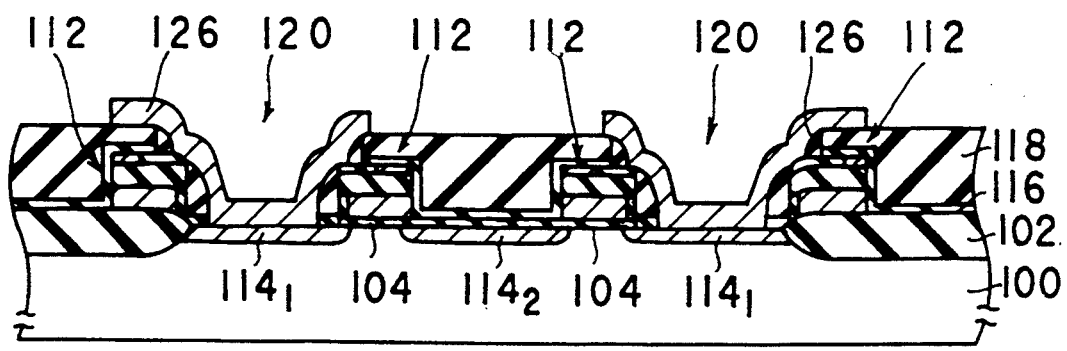
FIGS. 7A through 7O are sectional views used to explain a manufacturing method of semiconductor devices according to the sixth embodiment of the present invention.
Figure 7H:
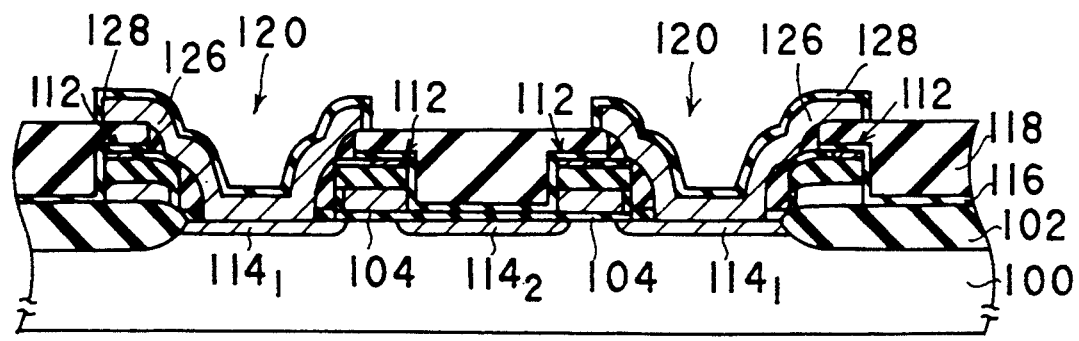
Figure 7I:
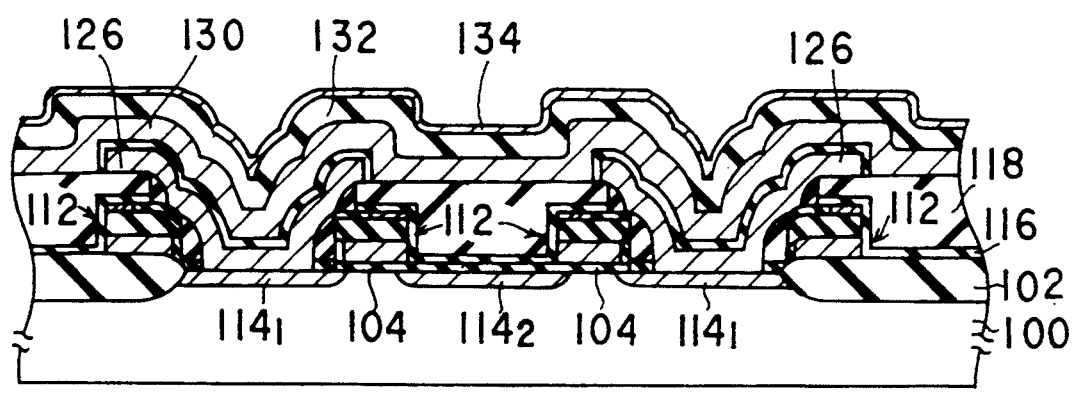
Figure 7J:
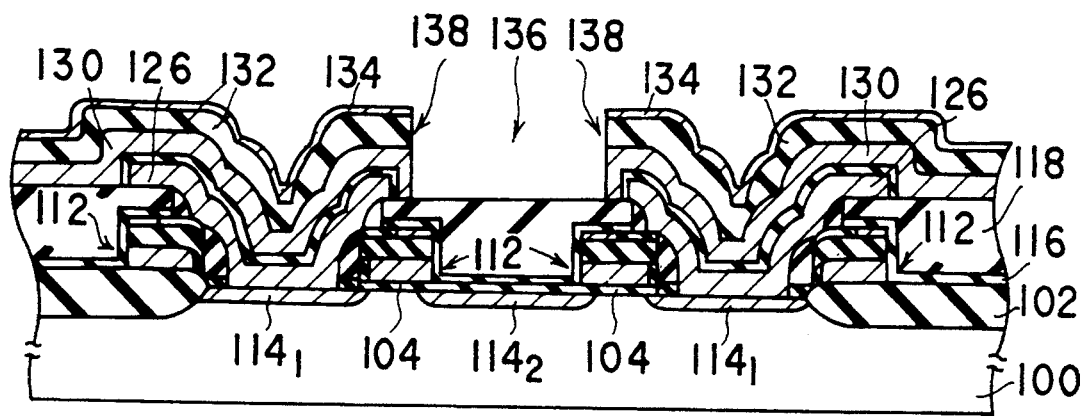
Figure 7K:
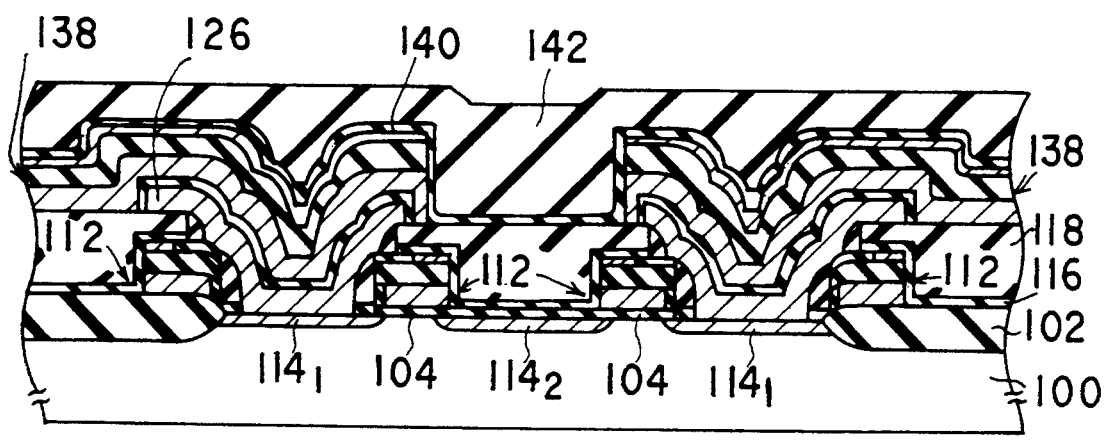
Figure 7N:
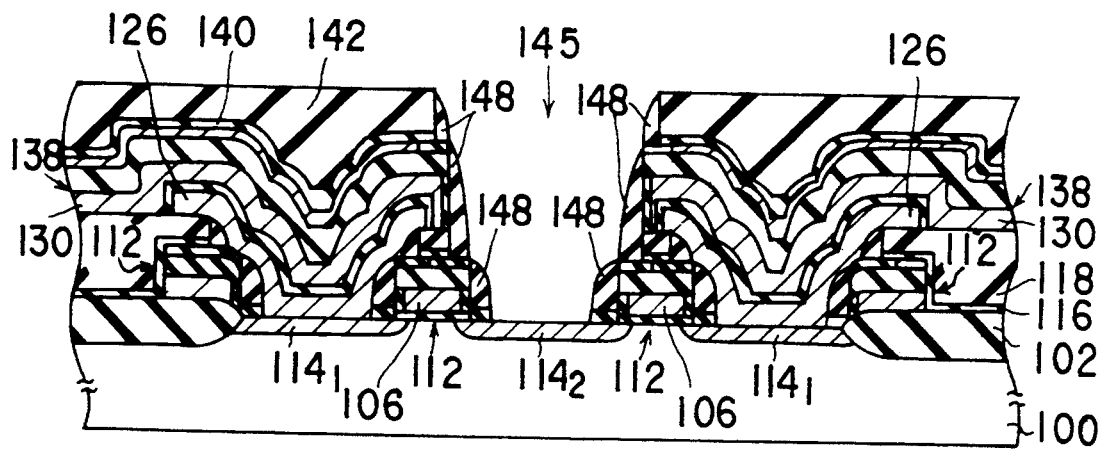
Figure 7O:
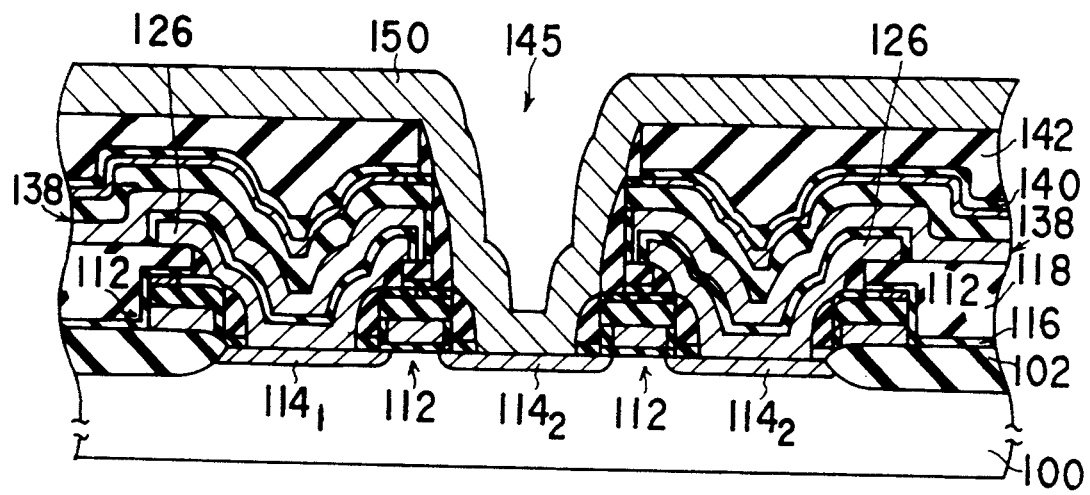

FIGS. 7A through 7O are sectional views used to explain a manufacturing method of semiconductor devices according to the sixth embodiment of the present invention. FIGS. 7A through 7O show the section taken along line 7—7 of FIG. 6 in the manufacturing sequence.

First, using LOCOS techniques, a silicon oxide film 102 of SiO$_2$ (hereinafter, referred to as a field oxide film) is formed in a selected region at the surface of the p-type silicon substrate 100 to define an element-formed area 101. Then, using thermal oxidation techniques, silicon appearing in the element-formed region 101 is oxidized to form a silicon oxide film 104 of $SiO_2$ (hereinafter, referred to as a gate oxide film) 104 of approximately 150 angstroms in thickness. Then, using LPCVD techniques, silicon is deposited on the substrate 100 to form a polysilicon film 106 of approximately 2000 angstroms in thickness. Next, by vapor phase diffusion techniques using a $POCl_3$ source, phosphorus is diffused in the polysilicon film 106 to turn the polysilicon film 106 conductive (into the n-type). Then, using LPCVD techniques, silicon dioxide is deposited on the polysilicon film 106 to form a silicon oxide film 108 of approximately 3000 angstroms in thickness. Then, using LPCVD techniques, silicon is deposited on the silicon oxide film 108 to form a polysilicon film 110 of approximately 100 angstroms in thickness (FIG. 7A).

Next, photoresist is applied onto the polysilicon film 110 to form a resist film. Then, using photolithography techniques, the resist film is etched to form a resist pattern (not shown) corresponding to a word line (a gate) pattern. Then, using RIE techniques, the polysilicon film 110, the silicon oxide film 108, and the n-type polysilicon film 106 are etched in sequence with the not-shown resist pattern as a mask. This provides a word-line pattern 112 containing a word line of the n-type polysilicon film 106, the silicon oxide film 108, and the polysilicon film 110. Then, using the word-line pattern 112 and the field oxide film 102 as masks, n-type impurity ions, such as arsenic (As), are injected into the substrate 100. As a result of this, an n-type impurity layer 114 1 serving as the source of a memory cell transistor and an n-type impurity layer $114_2$ serving as the drain are formed. After this, the not-shown resist pattern is removed (FIG. 7B).

Then, silicon dioxide and BPSG are deposited on the substrate 100, using LPCVD techniques, to form a silicon oxide film 116 of approximately 1000 angstroms in thickness and a BPSG film 118 of approximately 4000 angstroms in thickness. The silicon oxide film 116 and the BPSG film 118 function as interlayer insulating films. Then, the resulting structure is annealed in an atmosphere of nitrogen of 850° C. to allow the BPSG film 118 to reflow. This smooths the surface of the BPSG film 118 (FIG. 7C).

Next, photoresist is applied onto the BPSG film 118 to form a resist film. Then, using photolithography techniques, the resist film is etched to form a resist pattern (not shown) with a window. The not-shown window is made so as to be located in the area containing the contact region of the storage node electrode and the impurity layer $114_1$ and be wider than the distance between the word-line patterns 112. As a result, the sidewall of the not-shown window is located above the word-line patterns 112. Then, using RIE techniques with $CHF_3/CO$ ions as an etchant, the BPSG film 118, the silicon oxide film 116, and the gate oxide film 104 are etched in sequence with the not-shown resist pattern as a mask. This forms an opening portion 119 that leads to the surface of the impurity layer $114_1$ between the word-line patterns 112. At this time, because the etching speed of polysilicon is as slow as less than one-sixtieth that of BPSG and $SiO_2$, the polysilicon film 110 can act as a barrier layer that prevents the progress of etching. Because the progress of etching is slowed by the polysilicon film 110, the silicon oxide film 108 and the polysilicon film (word line) 106 formed under the polysilicon film 110 are prevented from being etched.

After this, the not-shown resist pattern is removed (FIG. 7D).

Then, using hydrogen-burning oxidation techniques at 850° C., the polysilicon film 110 is oxidized from the opening portion 119. This turns at least the polysilicon film 110 appearing in the opening portion 119 into an oxide ($SiO_2$) 110A, an insulator. By this oxidation process, a silicon oxide film ($SiO_2$) 122 of approximately 200 angstroms in thickness is formed on the surface of the substrate 100 (the n-type impurity layer $114_1$ in the figure) appearing in the opening portion 119. Further, an oxide 106A is also formed on the sidewall of the polysilicon film (word line) 106.

Next, using LPCVD techniques, silicon nitride ($SiN_X$) is deposited on the substrate 100 to form a silicon nitride film of approximately 1000 angstroms in thickness. Because silicon nitride is also deposited on the surface of the silicon oxide film 122 and the sidewall of the word-line pattern 112, the silicon nitride film is also formed inside the opening portion 119. Then, using RIE techniques, the silicon nitride film is etched back to form a contact window 120. Since the RIE technique, a type of anisotropic etching, permits the silicon nitride film to remain mainly on the sidewall of the word-line pattern 112 and the sidewall of the BPSG film 118, the sidewall insulating film 124 of silicon nitride can be obtained on the sidewall of the word-line pattern 112 and the sidewall of the BPSG film 118. Also in this etching process, because the silicon oxide film 122 is removed, the surface of the n-type impurity layer $114_1$ appears in the contact window 120 (FIG. 7F).

Then, using LPCVD techniques, silicon is deposited on the substrate 100 to form a polysilicon film of approximately 1000 angstroms in thickness. Next, by vapor phase diffusion techniques using a $POCl_3$ source, phosphorus is diffused in the polysilicon film to turn the polysilicon film conductive (into the n-type). Then, photoresist is applied onto the polysilicon film to form a resist film. Then, using photolithography techniques, the resist film is etched to form a resist pattern (not shown) corresponding to a storage node electrode pattern. Then, using RIE techniques, the polysilicon film is etched to form a storage node electrode 126 electrically connected to the n-type impurity layer $114_1$ with the not-shown resist pattern as a mask (FIG. 7G).

Next, using thermal oxidation techniques, the surface of the storage node electrode 126 is oxidized to form a capacitor dielectric film 128 (FIG. 7H).

Then, using LPCVD techniques, silicon is deposited on the substrate 100 to form a low-resistance polysilicon film of approximately 2000 angstroms in thickness. This polysilicon film is a plate electrode 130. Then, using LPCVD techniques, silicon dioxide is deposited on the plate electrode 130 to form a silicon oxide film 132 of approximately 1000 angstroms in thickness. Then, using LPCVD techniques, silicon is deposited on the silicon oxide film 132 to form a polysilicon film 134 of approximately 400 angstroms in thickness (FIG. 7I).

Next, photoresist is applied onto the polysilicon film 134 to form a resist film. Then, using photolithography techniques, the resist film is etched to form a resist pattern (not shown) corresponding to an opening portion that allows a bit line to lead to the substrate. Then, using RIE techniques, the polysilicon film 134, the silicon oxide film 132, and the plate electrode (polysilicon film) 130 are etched sequentially with the not-shown resist pattern as a mask. This provides a plate-electrode pattern 138 containing the plate electrode 130, the silicon oxide film 132, and the polysilicon film 134. The plate-electrode pattern 138 has an opening portion 136 that allows a bit line to leads to the substrate 100. The opening portion 136 is formed so as to be wider than the distance between the word-line patterns 112. As a result, the sidewall of the opening portion 136 is located above the word-line patterns 112. After this, the not-shown resist pattern is removed (FIG. 7J).

Then, silicon dioxide and BPSG are deposited on the substrate 100, using LPCVD techniques, to form a silicon oxide film 140 of approximately 1000 angstroms in thickness and a BPSG film 142 of approximately 4000 angstroms in thickness. The silicon oxide film 140 and the BPSG film 142 function as interlayer insulating films. Then, the resulting structure is annealed in an atmosphere of nitrogen of 850° C. to allow the BPSG film 142 to reflow. This smooths the surface of the BPSG film 142 (FIG. 7K).

Next, photoresist is applied onto the BPSG film 142 to form a resist film. Then, using photolithography techniques, the resist film is etched to form a resist pattern (not shown) with a window. The not-shown window is made so as to be located in the area containing the contact region of the bit line and the impurity layer $114_2$ and be wider than the distance between the word-line patterns 112 and than the width of the opening portion 136. As a result, the sidewall of the not-shown window is located above the word-line patterns 112. Then, using RIE techniques with $CHF_3/CO$ ions as an etchant, the BPSG film 142, the silicon oxide film 140, the BPSG film 118, the silicon oxide film 116, and the gate oxide film 104 are etched sequentially with the not-shown resist pattern as a mask. This forms an opening portion 144 that leads to the surface of the impurity layer 114 2 between the word-line patterns 112. During this etching, because the etching speed of polysilicon is as slow as less than one-sixtieth that of BPSG and $SiO_2$, the polysilicon films 110 and 134 can act as barrier layers that prevent the progress of etching. For this reason, the etching on the plate electrode pattern 138 is ceased at the polysilicon film 134, and the etching on the word-line pattern 112 is stopped at the polysilicon film 110. After this, the not-shown resist pattern is removed (FIG. 7L).

Then, using hydrogen-burning oxidation techniques at 850° C., the polysilicon films 110 and 134 are oxidized from the opening portion 144. This turns at least the polysilicon film 110 appearing in the opening portion 144 into an oxide ($SiO_2$) 110A, an insulator. Similarly, the polysilicon film 134 is turned into an oxide ($SiO_2$) 134A, an insulator. By this oxidation process, a silicon oxide film ($SiO_2$) 146 of approximately 150 angstroms in thickness is formed on the surface of the substrate 100 (the n-type impurity layer $114_2$ in the figure) appearing in the opening portion 144. Further, oxides 106A and 130A are also formed on the sidewall of the polysilicon film (word line) 106 and the sidewall of the polysilicon film 130 (FIG. 7M).

Next, using LPCVD techniques, silicon nitride ($SiN_X$) is deposited on the substrate 100 to form a silicon nitride film of approximately 1000 angstroms in thickness. Because silicon nitride is also deposited on the surface of the silicon oxide film 146, and the sidewalls of the word-line pattern 112, the BPSG film 118, the plate electrode pattern 138, and the BPSG film 142, the silicon nitride film is also formed inside the opening portion 144. Then, using RIE techniques, the silicon nitride film is etched back to form a contact window 145. The RIE technique, a type of anisotropic etching, permits the silicon nitride film to remain on the sidewalls of the word-line pattern 112, the BPSG film 118, the plate electrode pattern 138, and the BPSG film 142. As a result, the sidewall insulating film 148 of silicon nitride can be obtained on the sidewalls of the word-line pattern 112, the BPSG film 118, the plate electrode pattern 138, and the BPSG film 142. Also in this etching process, because the silicon oxide film 146 is removed, the surface of the n-type impurity layer $114_2$ appears in the contact window 145 (FIG. 7N).

Then, using LPCVD techniques, phosphorus-containing silicon is deposited on the BPSG film 142 to form a polysilicon film of approximately 3000 angstroms in thickness. Next, photoresist is applied onto the polysilicon film to form a resist film. Then, using photolithography techniques, the resist film is etched to form a resist pattern (not shown) corresponding to a bit-line pattern. Then, using RIE techniques, the polysilicon film is etched with the not-shown resist pattern 20 as a mask to form a bit line electrically connected to the n-type impurity layer $114_2$ (FIG. 7O).

Through the processes described above, dynamic RAM cells having a plan view pattern as shown in FIG. 6 are produced.

Next explained will be a manufacturing method of semiconductor devices according to a seventh embodiment of the present invention.

FIG. 8 is a plan view of a pattern showing the final shape of a dynamic RAM produced by a manufacturing method of semiconductor devices according to a seventh embodiment of the present invention.

As shown in FIG. 8, a contact portion SNC of a storage node electrode and a source region $114_1$ is provided in a region enclosed by a bit line BL and a word line WL. An element-formed region 101 is formed diagonally with respect to a plane so as to connect source regions $114_1$ to each other located on a diagonal line with a bit line BL between them. The bit line BL is electrically connected to the drain region $114_2$. In FIG. 8, for the sake of clarity. the storage node electrode and the sell plate electrode are omitted.

FIGS. 9A through 9K are first sectional views used to explain a manufacturing method of semiconductor devices according to the seventh embodiment of the present invention. FIGS. 9A through 9K show the section taken along line 9—9 of FIG. 8 in the manufacturing sequence.

FIGS. 10A through 10K are second sectional views used to explain a manufacturing method of semiconductor devices according to the seventh embodiment. FIGS. 10A through 10K show the section taken along line 10—10 of FIG. 8 in the manufacturing sequence.

FIGS. 11A through 11K are third sectional views used to explain a manufacturing method of semiconductor devices according to the seventh embodiment. FIGS. 11A through 11K show the section taken along line 11—11 of FIG. 8 in the manufacturing sequence.

First, using a similar manufacturing method to that explained in FIGS. 7A and 7B, a field oxide film 102 is formed at the surface of a p-type silicon substrate 100 to define an element-formed region 101. Then, a gate oxide film 104 is formed on the element-formed region 101. Then, a word-line pattern 112 containing a word line of an n-type polysilicon film 106, a silicon oxide film 108, and a polysilicon film 110 is formed on the substrate 100. Next, using the word-line pattern 112 and the field oxide film 102 as masks, n-type impurity ions, such as arsenic (As) ions, are injected into the substrate 100 to form an n-type impurity layer $114_1$ serving as the source of a memory cell transistor and an n-type impurity layer $114_2$ serving as the drain (FIGS. 9A, 10A, and 11A).

Figure 9B:
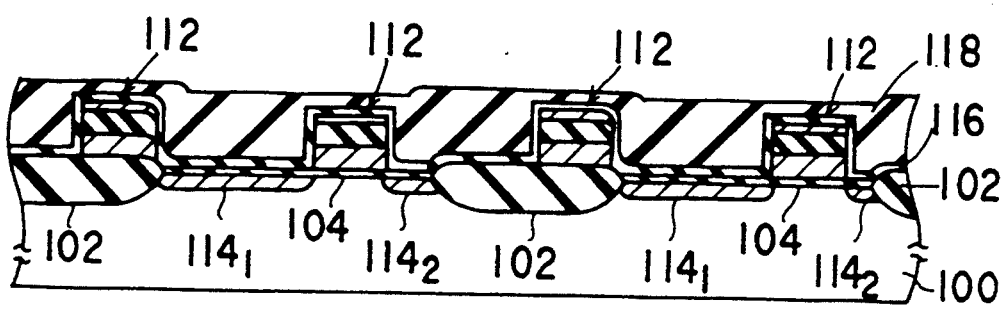
Figure 10B:
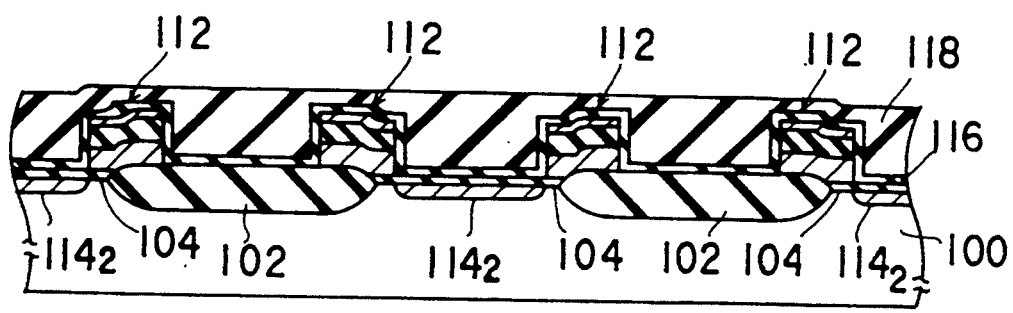
Figure 11B:
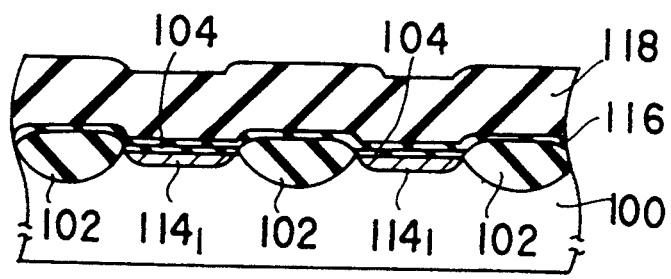

Next, using a similar manufacturing method to that explained in FIG. 7C, a silicon oxide film 116 and a BPSG film 118 are formed on the substrate 10. The silicon oxide film 116 and the BPSG film 118 function as interlayer insulating films. Then, the BPSG film 118 is allowed to reflow to smooth its surface (FIGS. 9B, 10B, and 11B).

Figure 9C:
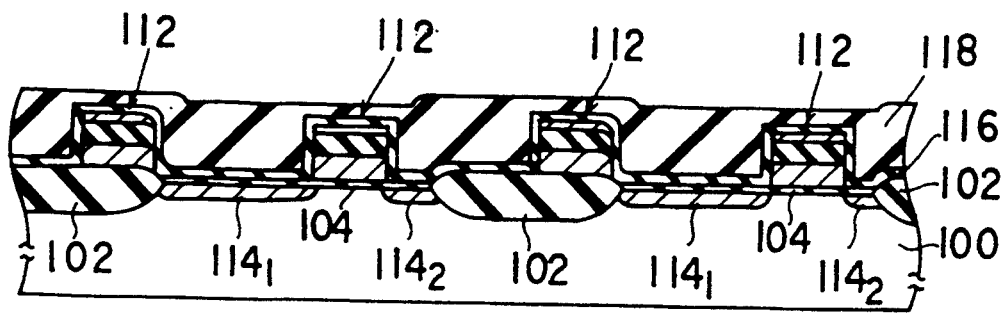
Figure 10C:
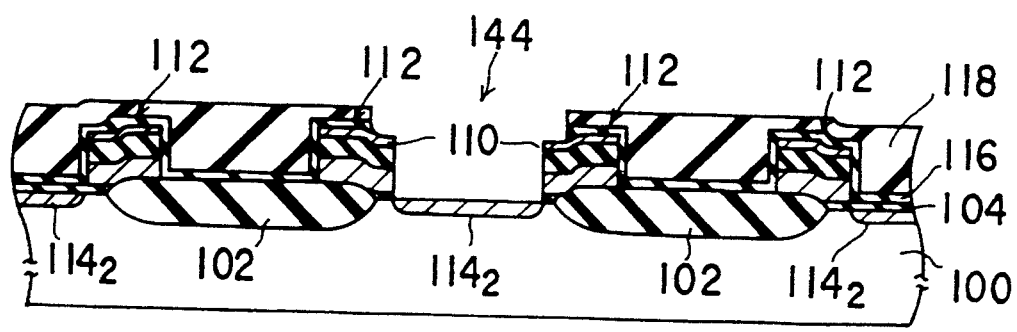
Figure 11C:
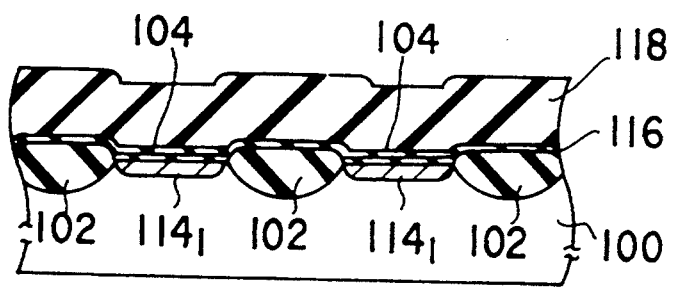

Next, photoresist is applied onto the BPSG film 118 to form a resist film. Then, using photolithography techniques, the resist film is etched to form a resist pattern (not shown) with a window. The not-shown window is made so as to be located in the area containing the contact region of the bit line and the impurity layer $114_2$ and be wider than the distance between the word-line patterns 112. As a result, the sidewall of the not-shown window is located above the word-line patterns 112. Then, using RIE techniques with $CHF_3/Co$ ions as an etchant, the BPSG film 118, the silicon oxide film 116, and the gate oxide film 104 are etched in sequence with the not-shown resist pattern as a mask. This forms an opening portion 114 that leads to the surface of the impurity layer $114_2$ between the word-line patterns 112. During this etching, because the etching speed of polysilicon is as slow as less than one-sixtieth that of BPSG and $SiO_2$, the polysilicon film 110 can act as a barrier layer that prevents the progress of etching. As a result, the etching on the word-line pattern 112 is stopped at the polysilicon film 110. After this, the not-shown resist pattern is removed (FIGS. 9C, 10C, and 11C).

Then, using hydrogen-burning oxidation techniques at 850° C., the polysilicon film 110 is oxidized from the opening portion 144. This turns at least the polysilicon film 110 appearing in the opening portion 144 into an oxide ($SiO_2$) 110A, an insulator. By this oxidation process, a silicon oxide film ($SiO_2$) 146 of approximately 200 angstroms in thickness is formed on the surface of the substrate 100 (the n-type impurity layer $114_2$ in the figure) appearing in the opening portion 144. Further, an oxide 106A is also formed on the sidewall of the polysilicon film (word line) 106 (FIGS. 9D, 10D, and 11D).

Figure 9E:
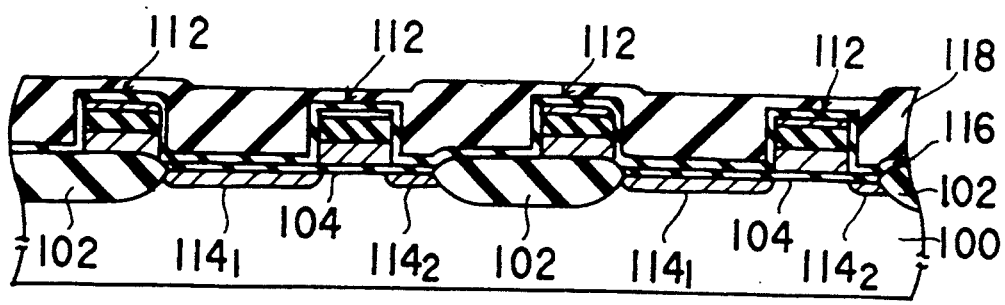
Figure 10E:
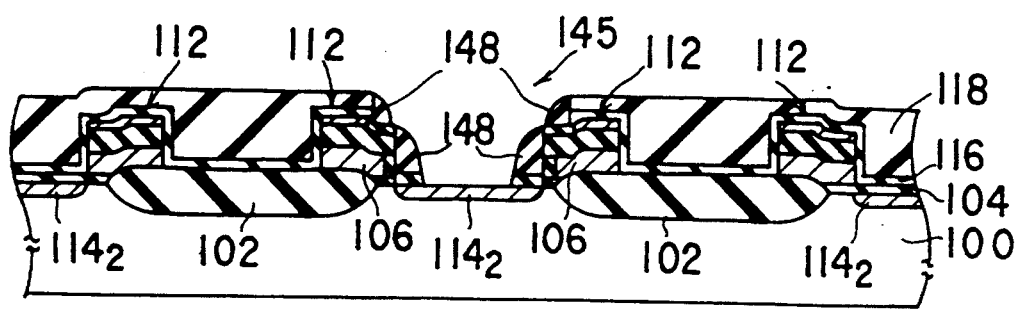
Figure 11E:
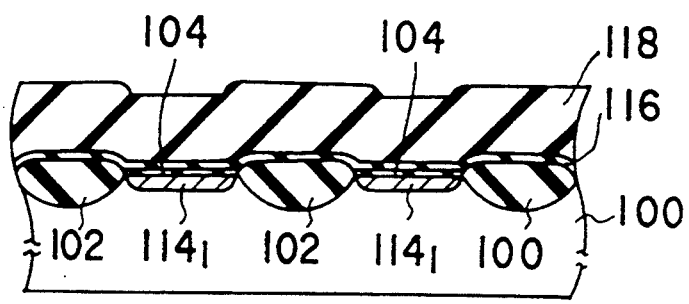

Next, using LPCVD techniques, silicon nitride ($SiN_X$) is deposited on the substrate 100 to form a silicon nitride film of approximately 1000 angstroms in thickness. Because silicon nitride is also deposited on the surface of the silicon oxide film 146 and the sidewall of the word-line pattern 112, the silicon nitride film is also formed inside the opening portion 144. Then, using RIE techniques, the silicon nitride film is etched back to form a contact window 145. Since the RIE technique, a type of anisotropic etching, permits the silicon nitride film to remain mainly on the sidewall of the word-line pattern 112 and the sidewall of the BPSG film 118, the sidewall insulating film 148 of silicon nitride can be obtained on the sidewall of the word-line pattern 112 and the sidewall of the BPSG film 118. Also in this etching process, because the silicon oxide film 146 is removed, the surface of the n-type impurity layer $114_2$ appears in the contact window $144_2$ (FIGS. 9E, 10E, and 11E).

Figure 9F:
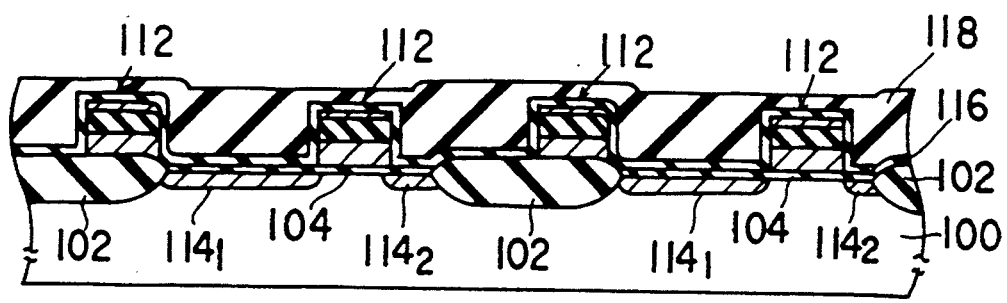
Figure 10F:
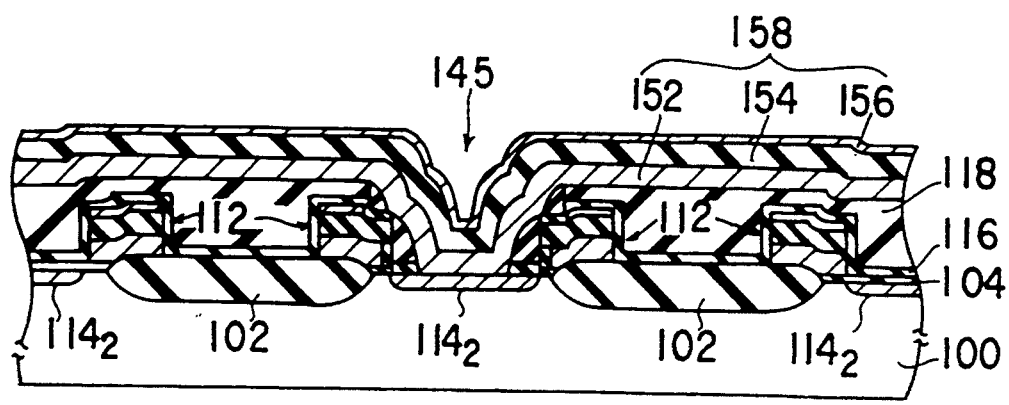
Figure 11F:
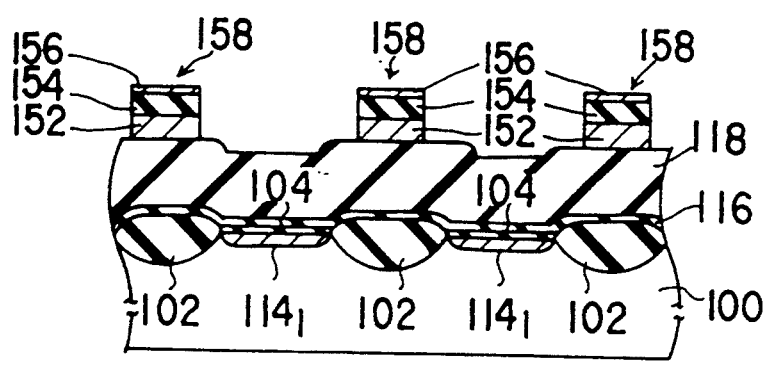

Then, using LPCVD techniques, silicon is deposited on the BPSG film 118 to form a polysilicon film of approximately 3000 angstroms in thickness. Next, by vapor phase diffusion techniques using a $POCl_3$ source, phosphorus is diffused in the polysilicon film to turn the polysilicon film conductive (into the n-type). The n-type polysilicon film is a bit line 152. Next, using LPCVD techniques, silicon dioxide is deposited on the polysilicon film (bit line) 152 to form a silicon oxide film 154 of approximately 1000 angstroms in thickness. Then, using LPCVD techniques, silicon is deposited on the silicon oxide film 154 to form a polysilicon film of approximately 250 angstroms in thickness. Then, photoresist is applied onto the polysilicon film 156 to form a resist film. Then, using photolithography techniques, the resist film is etched to form a resist pattern (not shown) corresponding to a bit-line pattern. Then, using RIE techniques, the polysilicon film 156, the silicon oxide film 154, and the n-type polysilicon film 152 are etched in sequence with the not-shown resist pattern as a mask. This provides a bit-line pattern 158 containing a bit line of the n-type polysilicon film 152, the silicon oxide film 154, and the polysilicon film 156. After this, the not-shown resist pattern is removed (FIGS. 9F, 10F, and 11F).

Figure 9G:
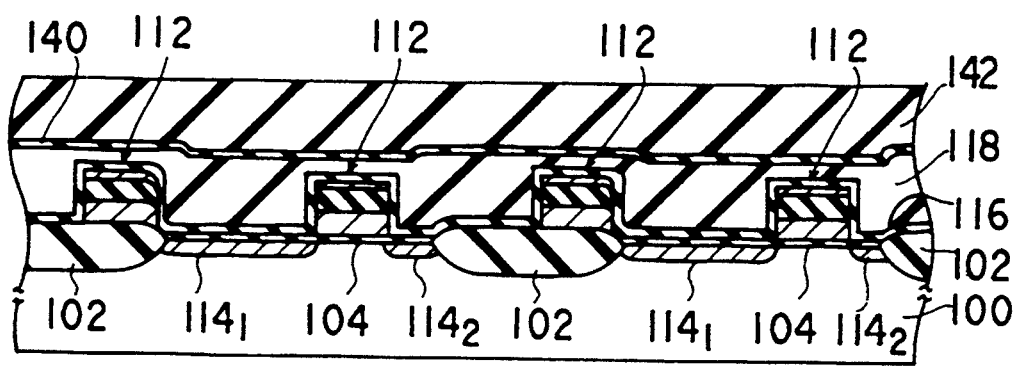
Figure 10G:
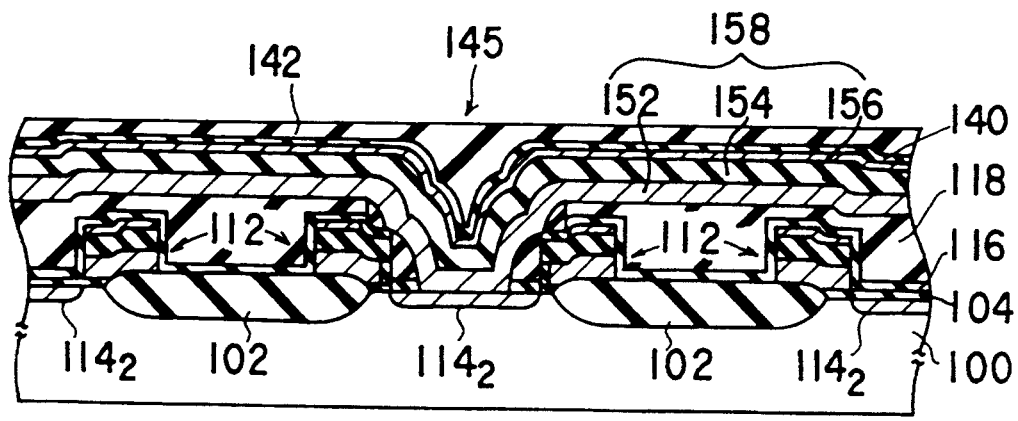
Figure 11G:
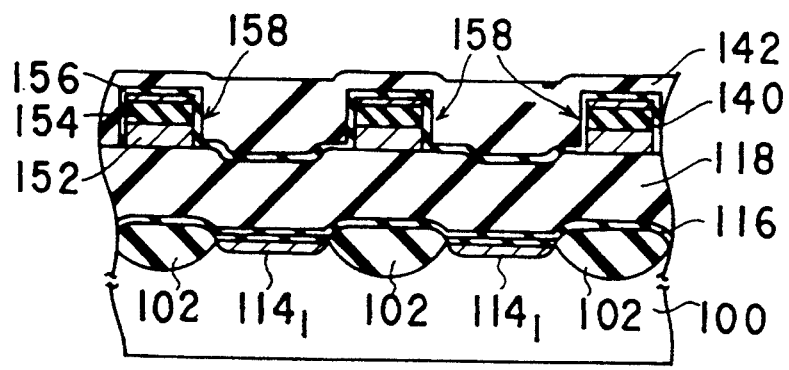

Then, silicon dioxide and BPSG are deposited on the substrate 100 in sequence, using LPCVD techniques, to form a silicon oxide film 140 of approximately 1000 angstroms in thickness and a BPSG film 142 of approximately 6000 angstroms in thickness. The silicon oxide film 140 and the BPSG film 142 function as interlayer insulating films. Then, the resulting structure is annealed in an atmosphere of nitrogen of 850° C. to allow the BPSG film 140 to reflow. This smooths the surface of the BPSG film 142 (FIGS. 9G, 10G, and 11G).

Figure 12:
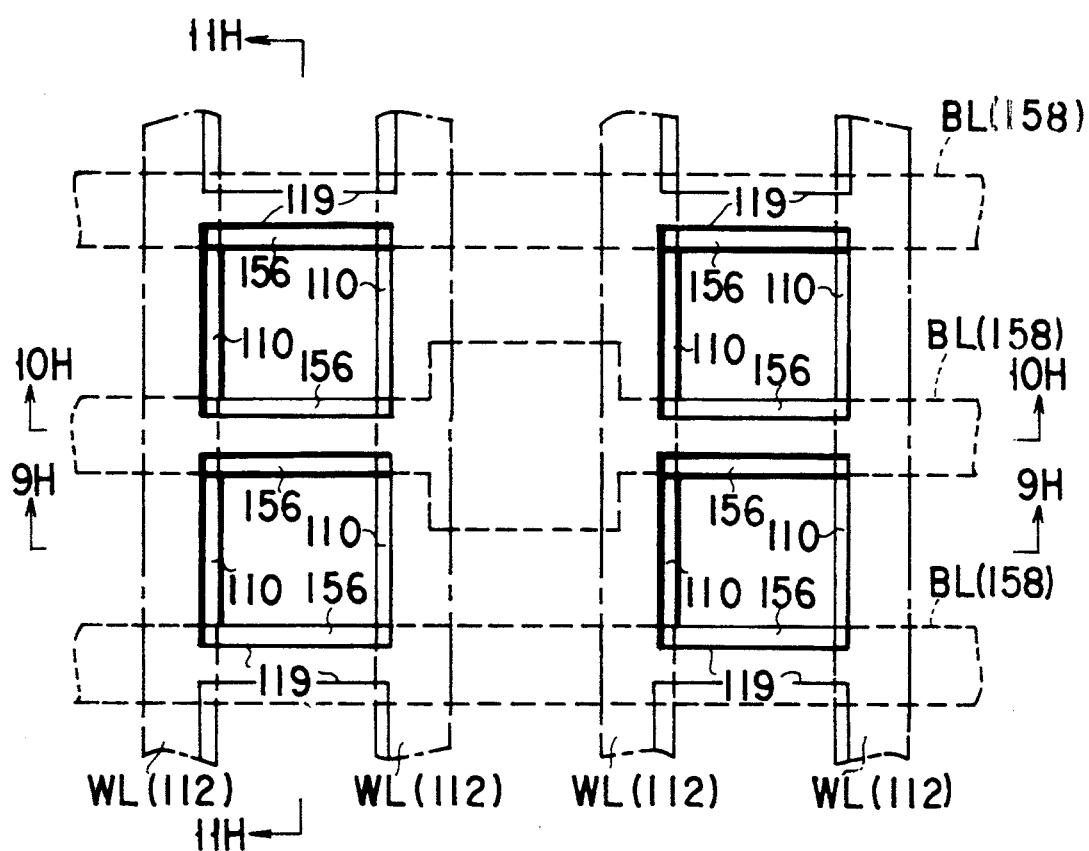
FIG. 12 is a plan view in the processes shown in FIGS. 9H, 10H, and 11H.

Next, photoresist is applied onto the BPSG film 142 to form a resist film. Then, using photolithography techniques, the resist film is etched to form a resist pattern (not shown) with a window. The not-shown window is made so as to be located in the area containing the contact region of the storage node electrode and the impurity layer $114_1$ and be wider than the distance between the word-line patterns 112. As a result, the sidewall of the not-shown window is located above the word-line patterns 112. Then, using RIE techniques with $CHF_3/CO$ ions as an etchant, the BPSG film 142, the silicon oxide film 140, the BPSG film 118, the silicon oxide film 116, and the gate oxide film 104 are etched in sequence with the not-shown resist pattern as a mask. This forms an opening portion 119 that leads to the surface of the impurity layer $114_1$ between the word-line patterns 112. During this etching, because the etching speed of polysilicon is as slow as less than one-sixtieth that of BPSG and $SiO_2$, the polysilicon films 110 and 156 act as barrier layers that prevent the progress of etching. As a result, the etching on the word-line pattern 112 is stopped at the polysilicon film 110, and the etching on the bit-line pattern 158 is ceased at the polysilicon film 156. After this, the not-shown resist pattern is removed (FIGS. 9H, 10H, and 11H). FIG. 12 is a plan view in the processes shown in FIGS. 9H, 10H, and 11H.

Then, using hydrogen-burning oxidation techniques at 850° C., the polysilicon films 110 and 156 are oxidized from the opening portion 119. This turns at least the polysilicon film 110 appearing in the opening portion 119 into an oxide ($SiO_2$) 110A, an insulator. Similarly, the polysilicon film 156 is turned into an oxide ($SiO_2$) 156A, an insulator. By this oxidation process, a silicon oxide film ($SiO_2$) 122 of approximately 200 angstroms in thickness is formed on the surface of the substrate 100

(the n-type impurity layer $114_1$ in the figure) appearing in the opening portion 119. Further, oxides 106A and 152A are also formed on the sidewall of the polysilicon film (word line) 106 and the sidewall of the polysilicon film (bit line) 152, respectively (FIGS. 9I, 10I, and 11I).

Figure 9J:
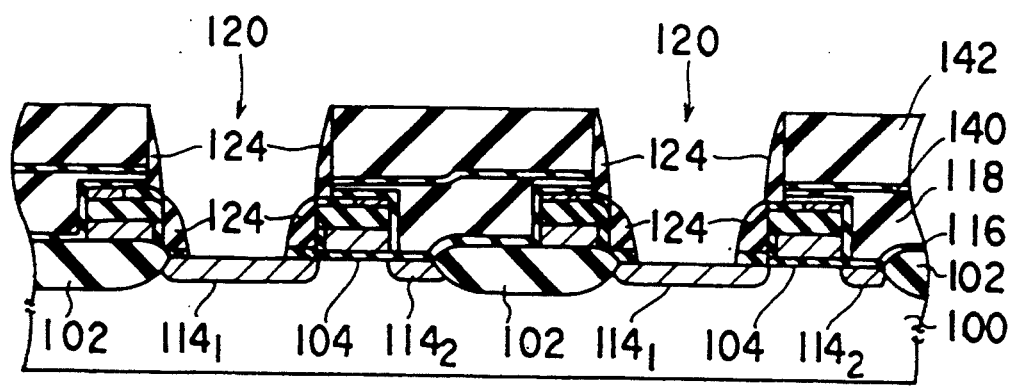
Figure 10J:
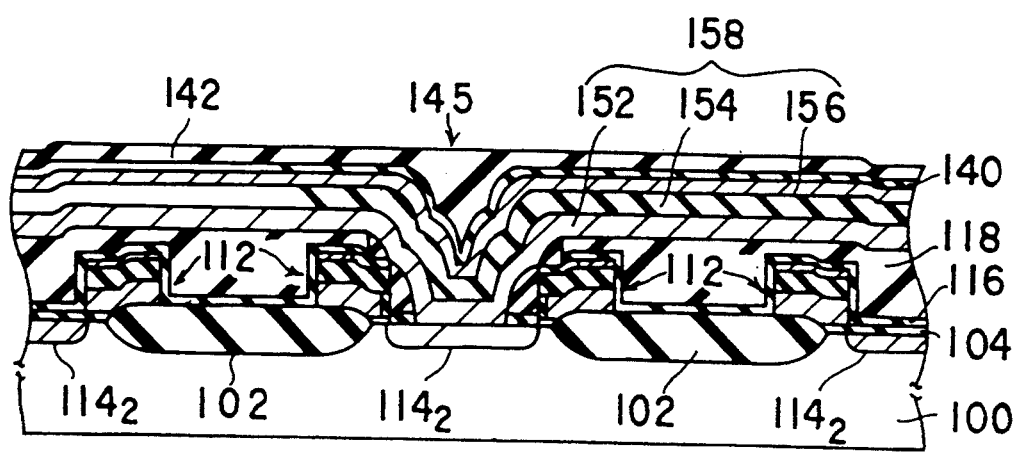
Figure 11J:
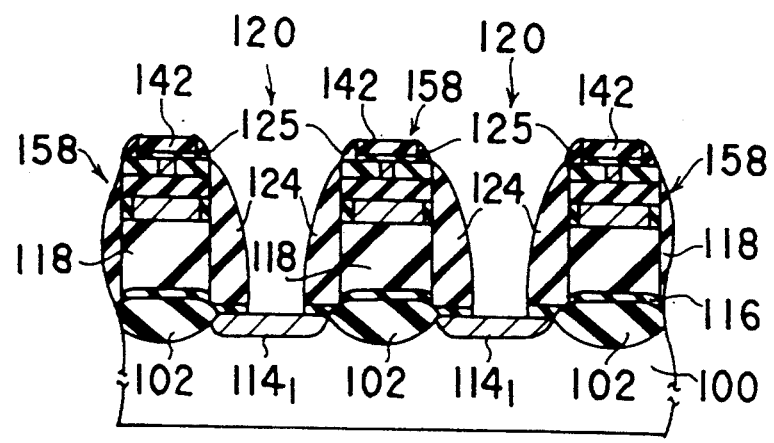
Figure 9K:
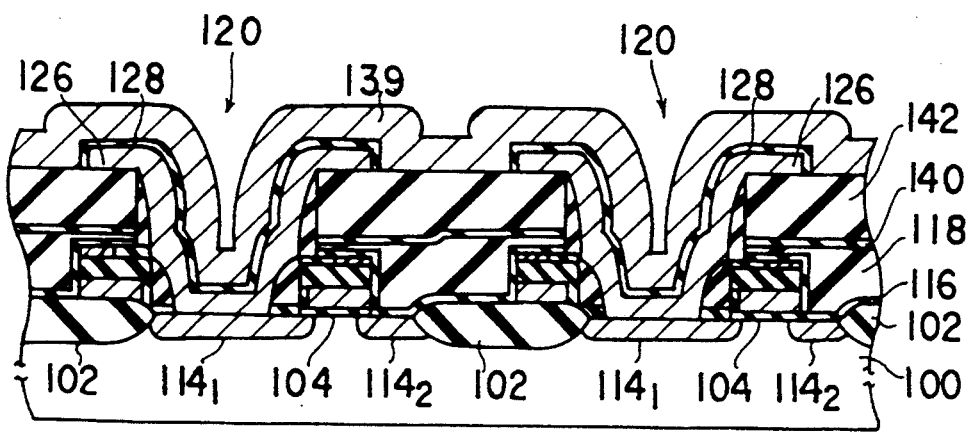
Figure 10K:
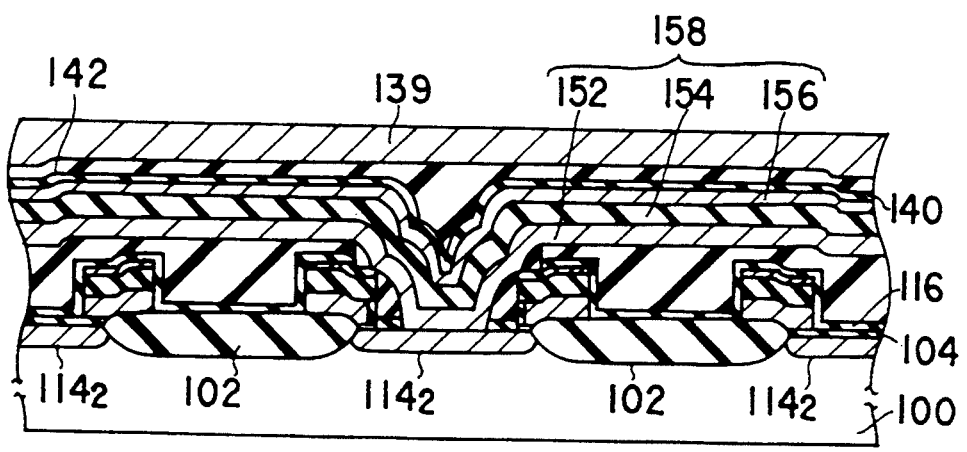
Figure 11K:
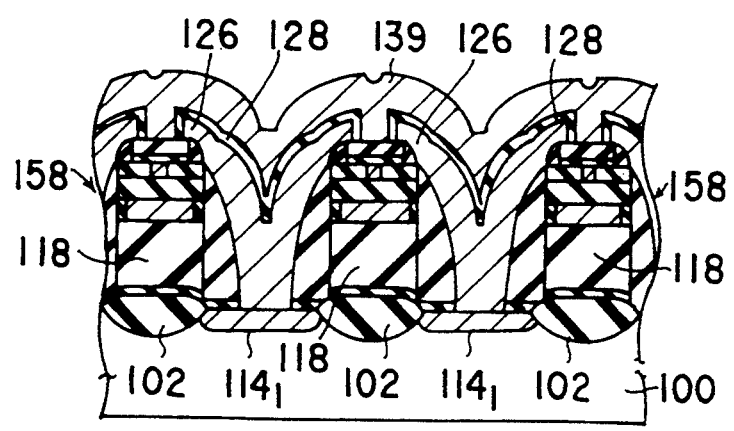

Next, using LPCVD techniques, silicon nitride (SiN$_X$) is deposited on the substrate 100 to form a silicon nitride film of approximately 1000 angstroms in thickness. Because silicon nitride is also deposited on the surface of the silicon oxide film 122, and the sidewalls of the word-line pattern 112, the BPSG film 118, the bit-line pattern 158, and the BPSG film 142, the silicon nitride film is also formed inside the opening portion 144. Then, using RIE techniques, the silicon nitride film is etched back to form a contact window 120. The RIE technique, a type of anisotropic etching, permits the silicon nitride film to remain on the sidewalls of the word-line pattern 112, the BPSG film 118, the bit-line pattern 158, and the BPSG film 142. Consequently, the sidewall insulating film 124 of silicon nitride can be obtained on the sidewalls of the word-line pattern 112, the BPSG film 118, the bit-line pattern 158, and the BPSG film 142. Also in this etching process, because the silicon oxide film 122 is removed, the surface of the n-type impurity layer $114_1$ appears in the contact window 145 (FIGS. 9J, 10J, and 11J).

Then, using LPCVD techniques, silicon is deposited on the substrate 100 to form a polysilicon film of approximately 1000 angstroms in thickness. Next, by vapor phase diffusion techniques using a POCl$_3$ source, phosphorus is diffused in the polysilicon film to turn the polysilicon film conductive (into the n-type). Next, photoresist is applied onto the polysilicon film to form a resist film. Then, using photolithography techniques, the resist film is etched to form a resist pattern (not shown) corresponding to a storage node electrode pattern. Then, using RIE techniques, the polysilicon film is etched to form a storage node electrode 126 electrically connected to the n-type impurity layer $114_1$ with the not-shown resist pattern as a mask. Next, using thermal oxidation techniques, the surface of the storage node electrode is oxidized to form a capacitor dielectric film. Next, using LPCVD techniques, silicon is deposited on the substrate 100 to form a low-resistance polysilicon film of approximately 3000 angstroms in thickness. This polysilicon film is a plate electrode 139.

Through the processes described above, dynamic RAM cells are formed which have a plan pattern as shown in FIG. 8.

With the manufacturing methods of semiconductor devices explained in the first and second embodiments, since the sidewall insulating films 68A and 68B are formed after the formation of the opening portion 63, the sidewall insulating films 68A and 68B are not exposed to an etchant used for etching to form the opening portion 63. This facilitates the control of the height and the remaining amount of the sidewall insulating films 68A and 68B. Because the sidewall insulating films 68A and 68B remain sufficiently inside the contact window 64, the insulation between internal wiring layers is good. Particularly, in the first and second embodiments, because the sidewall 68A of a sufficient thickness is left between the gate of the polysilicon film 14 and the bit line 40, the breakdown voltage between the gate and the bit line can be improved.

With the manufacturing methods of semiconductor devices explained in the first and second embodiments, the conductive polysilicon film 14, the polysilicon film 18, and the silicon oxide film 16 are patterned at a time. As a result, the polysilicon film 18 has the same pattern as that of the gate pattern, which prevents the gates from being short-circuited to each other via the polysilicon film 18.

Further, because during the patterning, the polysilicon film 18 can be removed from the top of the substrate 10 in which a contact window is to be formed, it is not necessary to add a process of removing the polysilicon film 18 from the top of the substrate later. This simplifies the processes, improving the production of semiconductor devices.

By this patterning, most of the polysilicon film 18 is removed so that it remains only on the gate. In consequence, the remaining amount of the polysilicon film 18 is reduced, which facilitates the oxidation of the polysilicon film 18. Since the oxidized polysilicon film 18 is an insulator, this prevents the polysilicon film 18 from short-circuiting the internal wiring layers to one another formed inside the contact window 64.

With the manufacturing method of semiconductor devices explained in the first embodiment, the reflow of the BPSG film 22 and the oxidation of the polysilicon film 18 are performed in the same process and these films are integrally formed. By this method, the reflow of the BPSG film 22 and the oxidation of the polysilicon film 18 are carried out simultaneously, not separately, which simplifies the processes.

With the manufacturing method of semiconductor devices explained in the third embodiment, since the sidewall insulating films 54A through 54C are formed after the formation of the opening portion 50, the sidewall insulating films 54A through 54C are not exposed to an etchant used for etching to form the opening portion 50. Therefore, as with the first and second embodiments, because the sidewall insulating films 54A through 54C remain sufficiently inside the contact window 51, the insulation between internal wiring layers can be improved. Particularly, with the third embodiment, in a semiconductor device with a multilayer structure of internal wiring layers, the breakdown voltage between the internal wiring layers can be improved.

As with the manufacturing method of semiconductor devices according to the fourth embodiment, a contact window may be formed in a self-aligning manner in any one of the internal wiring layers formed into a multilayer structure. For example, in the manufacturing method of semiconductor devices according to the fourth embodiment, the contact window 51 is formed in a self-aligning manner in the first-level wiring layer pattern 22. Because the sidewall insulating films 54A and 54B are formed after the formation of the opening portion 50 as with the third embodiment, the same effect as with the third embodiment can be obtained.

Further, the conductive polysilicon film 14 and the tungsten silicide 32 as well as the polysilicon films 18 and 36 serving as barrier layers and the silicon oxide films 16 and 36 are all patterned at a time. As a result, the polysilicon films 18 and 26 have the same pattern as that of the wiring pattern, which prevents the wiring layers from being short-circuited to each other via the polysilicon film 18.

As with the manufacturing method of semiconductor devices according to the fifth embodiment, the present invention allows a contact window to be formed in at least one internal wiring layer in a semiconductor device where three or more internal wiring layers are formed into a multilayer structure.

With the manufacturing method of semiconductor devices according to the sixth and seventh embodiments, the present invention is applied to the manufacturing of dynamic RAM memory cells.

With the manufacturing method of semiconductor devices according to the sixth embodiment, since the sidewall insulating film 124 is formed after the formation of the opening portion 119, the sidewall insulating film 124 is not exposed to an etchant used for etching to form the opening portion 119. Therefore, because the sidewall insulating film 124 remains sufficiently inside the contact window 120, the breakdown voltage between the word line 106 and the storage node electrode 126 can be improved.

Further, with the manufacturing method of semiconductor devices according to the sixth embodiment, since the sidewall insulating film 148 is formed after the formation of the opening portion 144, the sidewall insulating film 148 is not exposed to an etchant used for etching to form the opening portion 144. Therefore, because the sidewall insulating film 148 remains sufficiently inside the contact window 145, the breakdown voltage between the plate electrode 130, the word line 106, and the bit line 150 can be improved.

With the manufacturing method of semiconductor devices according to the seventh embodiment, since the sidewall insulating film 148 is formed after the formation of the opening portion 144, the sidewall insulating film 148 is not exposed to an etchant used for etching to form the opening portion 144. Therefore, because the sidewall insulating film 148 remains sufficiently inside the contact window 145, the breakdown voltage between the word line 106 and the bit line 152 can be improved.

Further, with the manufacturing method of semiconductor devices according to the seventh embodiment, since the sidewall insulating film 124 is formed after the formation of the opening portion 119, the sidewall insulating film 124 is not exposed to an etchant used for etching to form the opening portion 119. Therefore, because the sidewall insulating film 124 remains sufficiently inside the contact window 120, the breakdown voltage between the bit line 152, the word line 106, and the storage node electrode can be improved.

The present invention is not restricted to the manufacturing methods explained in the first through seventh embodiments. It goes without saying that the invention may be applied to semiconductor devices with contact windows other than those explained so far.

While in the manufacturing methods explained in the first through seventh embodiments, the internal wiring layer using an n-type polysilicon film as a conducting material and the internal wiring layer using an aluminium alloy as a conducting material are shown, other types of conducting material may be used.

While in the manufacturing methods explained in the first through seventh embodiments, polysilicon is used as a barrier layer that prevents the progress of etching, other materials other than polysilicon may be used: they include hafnium (Hf), tantalum (Ta), zirconium (Zr), tungsten silicide ($WSi_2$), molybdenum silicide ($MoSi_2$), hafnium silicide ($HfSi_2$), tantalum silicide ($TaSi_2$), and zirconium silicide ($ZrSi_2$). Like polysilicon, all these materials, when subjected to heat treatment in an oxidizing atmosphere at temperatures of 700° C. or more, turn into an insulator.

With the manufacturing methods explained in the first through seventh embodiments, the barrier layer is formed by stacking a silicon oxide film and a polysilicon film. This barrier can prevent the progress of etching differently (resistance to etching), depending on the etchant, in such a manner that polysilicon acts on a $CHF_3/CO$ etchant and silicon dioxide acts on a $Cl_2$ etchant. This provides the barrier layer with etch resistance to various etchants, which enhances the etch resistance of the barrier layer as a whole.

While in the manufacturing methods explained in the first through seventh embodiments, BPSG is used as the interlayer insulating film, the interlayer insulating film may be composed of phosphosilicate glass (PSG) or borosilicate glass (BSG). Like BPSG, all these materials can be allowed to reflow by heat treatment in an oxidizing atmosphere at temperatures 700° C. or more. They provide selective etching together with Si, Hf, Ta, Zr, $WSi_2$, $MoSi_2$, $HfSi_2$, $TaSi_2$, and $ZrSi_2$.

While in the manufacturing methods explained in the first through seventh embodiments, the sidewall insulating film is made of silicon nitride, the sidewall insulating film may be of other materials as long as they are insulators, not limited to silicon nitride.

Additional advantages and modifications will readily occur to those skilled in the art. Therefore, the invention in its broader aspects is not limited to the specific details and illustrated examples shown and described herein. Accordingly, various modifications may be made without departing from the spirit or scope of the general inventive concept as defined by the appended claims and their equivalents.

What is claimed is:

1. A manufacturing method of semiconductor devices, comprising the steps of:
   forming a plurality of pattern portions containing internal wiring layers over a semiconductor substrate;
   forming interlayer insulating films for insulating said internal wiring layers from each other over said semiconductor substrate;
   forming an opening portion, in said interlayer insulating films, which allows said substrate and at least one of said pattern portions to appear; and
   forming a sidewall insulating film on the sidewall of at least one of said pattern portions appearing in said opening portion.

2. A manufacturing method according to claim 1, wherein said patterns are provided with protective layers for protecting said internal wiring layers from an etchant used to form said opening portion.

3. A manufacturing method according to claim 1, wherein said sidewall insulating film is formed by forming an insulating film from the inside of said opening portion to said interlayer insulating films and then anisotropically etching the resulting insulating film.

4. A manufacturing method according to claim 2, wherein said protective layers are made of a material that is to be etched at a speed lower than the etching speed of said interlayer insulating films during etching for the formation of said opening portion.

5. A manufacturing method according to claim 4, wherein said protective layers are made of a material mainly containing silicon, when said interlayer insulating films are made of a material mainly containing silicate glass.

6. A manufacturing method according to claim 5, wherein said material mainly containing silicon is oxidized after the formation of said opening portion.

7. A manufacturing method of semiconductor devices, comprising the steps of:
   forming a plurality of first pattern portions containing first-level internal wiring layers over a semiconductor substrate;
   forming first interlayer insulating films for insulating said first-level internal wiring layers from each other over said semiconductor substrate;
   forming a plurality of second pattern portions containing second-level internal wiring layers over said first inter layer insulating films;
   forming second interlayer insulating films for insulating said second-level internal wiring layers from each other over said semiconductor substrate;
   forming an opening portion, penetrating through said second interlayer insulating films and said first interlayer insulating films, which allows said substrate and at least one portion of said first and second pattern portions to appear; and
   forming a sidewall insulating film on the sidewall of at least one of said first pattern portions appearing in said opening portion.

8. A manufacturing method according to claim 7, wherein said first patterns are provided with protective layers for protecting said first-level internal wiring layers from an etchant used to form said opening portion.

9. A manufacturing method according to claim 7, wherein said sidewall insulating film is formed by forming an insulating film from the inside of said opening portion to said second interlayer insulating films and then anisotropically etching the resulting insulating film.

10. A manufacturing method according to claim 8, wherein said protective layers are made of a material that is to be etched at a speed lower than the etching speed of said first and second interlayer insulating films during etching for the formation of said opening portion.

11. A manufacturing method according to claim 10, wherein said protective layers are made of a material mainly containing silicon, when said first and second interlayer insulating films are made of a material mainly containing silicate glass.

12. A manufacturing method according to claim 11, wherein said material mainly containing silicon is oxidized after the formation of said opening portion.

13. A manufacturing method of semiconductor devices, comprising the steps of:
   forming a plurality of first pattern portions containing first-level internal wiring layers over a semiconductor substrate;
   forming first interlayer insulating films for insulating said internal wiring layers from each other over said semiconductor substrate;
   forming a plurality of second pattern portions containing second-level internal wiring layers over said first interlayer insulating films;
   forming second interlayer insulating films for insulating said second-level internal wiring layers from each other over said semiconductor substrate;
   forming an opening portion, penetrating through said second interlayer insulating films and said first interlayer insulating films, which allows said substrate, at least one of said first pattern portions and at least one of said second pattern portions to appear; and
   forming a sidewall insulating film on each of the sidewalls of at least one of said first pattern portions and at least one of said second pattern portions appearing in said opening portion.

14. A manufacturing method according to claim 13, wherein said first patterns are provided with first protective layers for protecting said first-level internal wiring layers from an etchant used to form said opening portion; and said second patterns are provided with second protective layers for protecting said second-level internal wiring layers from an etchant used to form said opening portion.

15. A manufacturing method according to claim 13, wherein said sidewall insulating film is formed by forming an insulating film from the inside of said opening portion to said second interlayer insulating films and then anisotropically etching the resulting insulating film.

16. A manufacturing method according to claim 14, wherein said first and second protective layers are made of a material that is to be etched at a speed lower than the etching speed of said first and second interlayer insulating films during etching for the formation of said opening portion.

17. A manufacturing method according to claim 16, wherein said first and second protective layers are made of a material mainly containing silicon, when said first and second interlayer insulating films are made of a material mainly containing silicate glass.

18. A manufacturing method according to claim 17, wherein said material mainly containing silicon is oxidized after the formation of said opening portion.

* * * * *